United States Patent
Morishita

(10) Patent No.: US 9,318,999 B2
(45) Date of Patent: Apr. 19, 2016

(54) SAMPLING MIXER CIRCUIT AND RECEIVER

(71) Applicant: Panasonic Corporation, Osaka (JP)

(72) Inventor: Yohei Morishita, Kanagawa (JP)

(73) Assignee: Panasonic Corporation, Osaka (JP)

( * ) Notice: Subject to any disclaimer, the term of this patent is extended or adjusted under 35 U.S.C. 154(b) by 14 days.

(21) Appl. No.: 14/368,770

(22) PCT Filed: Jan. 22, 2013

(86) PCT No.: PCT/JP2013/000272
§ 371 (c)(1),
(2) Date: Jun. 25, 2014

(87) PCT Pub. No.: WO2013/111565
PCT Pub. Date: Aug. 1, 2013

(65) Prior Publication Data
US 2014/0362957 A1 Dec. 11, 2014

(30) Foreign Application Priority Data

Jan. 24, 2012 (JP) ................................. 2012-012374

(51) Int. Cl.
*H03D 7/16* (2006.01)
*H04B 1/26* (2006.01)
(Continued)

(52) U.S. Cl.
CPC .................. *H03D 7/00* (2013.01); *G11C 19/00* (2013.01); *G11C 27/024* (2013.01); *H03D 7/125* (2013.01);
(Continued)

(58) Field of Classification Search
CPC ... H03D 3/006; H03D 7/16; H03D 2200/006; H03D 2200/0084; H04B 1/30

USPC .................. 455/131, 313, 318, 319, 323, 334; 327/94, 103, 355, 554; 375/346, 350
See application file for complete search history.

(56) References Cited

U.S. PATENT DOCUMENTS 8,229,987 B2 * 7/2012 Hosokawa ............. H03D 7/125
  341/122
8,385,874 B2 * 2/2013 Abe ....................... H03D 3/006
  327/356

(Continued)

FOREIGN PATENT DOCUMENTS

WO 2010/064450 A1 6/2010
WO 2010/064451 A1 6/2010
WO 2011/024481 A1 3/2011

OTHER PUBLICATIONS

International Search Report dated Apr. 23, 2013, for corresponding International Application No. PCT/JP2013/000272, 5 pages.
(Continued)

*Primary Examiner* — Quochien B Vuong
(74) *Attorney, Agent, or Firm* — Seed IP Law Group PLLC

(57) ABSTRACT

The sampling mixer circuit comprises: a clock generating circuit that outputs four-phase control signals the periods of which are in accordance with the carrier frequency of an input signal and the phases of which are different from one another; a voltage-to-current converting circuit that converts a voltage signal based on the input signal to a current signal; four-system charge sharing circuits in which the current signal as converted is input to a plurality of capacitors in accordance with the different phases based on the four-phase control signals and in which charges are exchanged among the plurality of capacitors; and a phase-to-phase capacitor that is selectively connected, on the basis of the four-phase control signals, to the respective ones of nodes, which are other than the input nodes of the current signal, in the four-system charge sharing circuits.

20 Claims, 28 Drawing Sheets

(51) Int. Cl.
*H03D 7/00* (2006.01)
*H03D 7/12* (2006.01)
*H03D 7/18* (2006.01)
*G11C 19/00* (2006.01)
*G11C 27/02* (2006.01)
*H03H 19/00* (2006.01)
*H04B 7/08* (2006.01)
*H04L 25/08* (2006.01)
*H03H 15/00* (2006.01)
*H03D 7/14* (2006.01)

(52) U.S. Cl.
CPC ............... *H03D 7/1441* (2013.01); *H03D 7/18* (2013.01); *H03H 15/00* (2013.01); *H03H 19/004* (2013.01); *H04B 7/0885* (2013.01); *H04L 25/08* (2013.01); *H03D 2200/0062* (2013.01); *H03D 2200/0068* (2013.01)

(56) References Cited

U.S. PATENT DOCUMENTS

| | | | |
|---|---|---|---|
| 8,570,100 B2 * | 10/2013 | Morishita | H04B 1/0007 327/355 |
| 2003/0035499 A1 | 2/2003 | Staszewski et al. | |
| 2005/0233725 A1 | 10/2005 | Muhammad et al. | |
| 2011/0183639 A1 | 7/2011 | Morishita | |
| 2011/0199122 A1 | 8/2011 | Morishita et al. | |

OTHER PUBLICATIONS

Staszewski et al., "All-Digital TX Frequency Synthesizer and Discrete-Time Receiver for Bluetooth Radio in 130-nm CMOS," IEEE Journal of Solid-State Circuits, 39(12), Dec. 2004, 14 pages.

Yamashita et al., "Direct Sampling Mixer with Complex Poles Enhansing Sharpness Passband Edge Characterstic," Toyohashi University of Technology, 29-33, 5 pages.

* cited by examiner

PRIOR ART

SAMPLING MIXER CIRCUIT AND RECEIVER

TECHNICAL FIELD

The present invention relates to a sampling mixer circuit that performs frequency conversion and filter processing by means of discrete-time analog processing and also to a receiver using the sampling mixer circuit.

BACKGROUND ART

A configuration has been known that performs reception processing by means of direct discrete-time sampling of a high-frequency signal with the aim of achieving a smaller receiver with lower power consumption and integrating the analog signal processer and digital signal processer (see, for example, PTL 1 and NPL 1).

FIG. 1 shows the overall configuration of a sampling circuit disclosed in PTL 1. FIG. 2 is a timing chart showing control signals inputted to the circuit shown in FIG. 1. The direct sampling circuit shown in FIG. 1 performs frequency conversion on a received analog RF (radio frequency) signal using a multi-tap direct sampling mixer to obtain a discrete-time analog signal. To be more specific, electrical charge transfer between a plurality of capacitors included in the sampling circuit in FIG. 1 realizes filter characteristics resulting in the product of an FIR (finite impulse response) filer and an IIR (infinite impulse response) filter. Characteristics around the passband are determined based on second-order IIR filter characteristics. FIG. 3A shows an example of wideband frequency characteristics and FIG. 3B shows an example of narrowband frequency characteristics around the passband.

Furthermore, a configuration based on the above-described configuration is known whose transfer function includes a complex pole (NPL 2). FIG. 4 illustrates the overall configuration of a direct sampling circuit disclosed in NPL 2. FIG. 5 is a timing chart illustrating control signals inputted to the circuit in FIG. 4. FIG. 6 is an example of frequency characteristics obtained by the circuit in FIG. 4 (local (LO) frequency $f_{LO}$=2.4 GHz). The direct sampling circuit is known to obtain ripples in the passband by including a complex pole in a transfer function.

CITATION LIST

Patent Literature

PTL 1
US Patent Application Publication No. 2003-0035499

Non-Patent Literature

NPL 1
IEEE Journal of Solid-State Circuits, Vol. 39, No. 12, December 2004, "All-Digital Tx Frequency Synthesizer and Discrete-time Receiver for Blue tooth Radio in 130-nm CMOS"

NPL 2
The Institute of Electrical Engineers of Japan, Electronics Division, ECT-08-89, November 2008, "Direct Sampling Mixer with Complex Poles Enhancing Sharpness Passband Edge Characteristic"

SUMMARY OF INVENTION

Technical Problem

However, the above-described related art has the following problems. In the conventional direct sampling circuit as shown in FIG. 1, since the vicinity of a passband is determined by second-order IIR of a real number pole, it is difficult to realize wideband and steep filter characteristics. The direct sampling circuit employing the configuration shown in FIG. 4 can realize a complex pole on a transfer function and realize filter characteristics with a flat passband. However, a transfer function of this configuration has a configuration in which the coefficient of a second-order polynomial of the denominator in equation 1 is less than 1, and the range of the realizable pole is narrow. Moreover, it is difficult to design zero points in IIR and realize image rejection filter characteristics.

[1]

$$T = \frac{1}{1 - C_H/(C_H + C_F + C_R)z^{-1} + C_F/(C_H + C_F + C_R)z^{-2}} \quad \text{(Equation 1)}$$

The present invention has been made in view of the above-described problems, and aims to provide a sampling mixer circuit and a receiver having a high degree of freedom in setting positions of a zero point and a pole of a transfer function and allowing desired filter characteristics to be easily formed.

Solution to Problem

A sampling mixer circuit according to an aspect of the present invention includes: a clock generating circuit that outputs control signals with four different phases having cycles corresponding to carrier frequencies of an input signal; a voltage-to-current conversion circuit that converts a voltage signal based on the input signal to a current signal; four-system charge sharing circuits each of which inputs the converted current signal to a plurality of capacitors according to different phases based on the four-phase control signals and that exchanges charge among the plurality of capacitors; and an inter-phase capacitor that switches connections to nodes other than input nodes of the current signal in the four-system charge sharing circuits based on the four-phase control signals.

Advantageous Effects of Invention

According to the present invention, it is possible to realize a sampling mixer circuit having a high degree of freedom in setting positions of a zero point and a pole of a transfer function and allowing desired filter characteristics to be easily obtained.

BRIEF DESCRIPTION OF DRAWINGS

FIG. 24A showing a circuit diagram thereof and FIG. 24B showing a block diagram illustrate a terminal configuration thereof;

FIG. 25A showing a circuit diagram thereof and FIG. 25B showing a block diagram illustrating a terminal configuration thereof;

DESCRIPTION OF EMBODIMENTS

Hereinafter, embodiments of the present invention will be described in detail with reference to the accompanying drawings.

Embodiment 1

Figure 1:
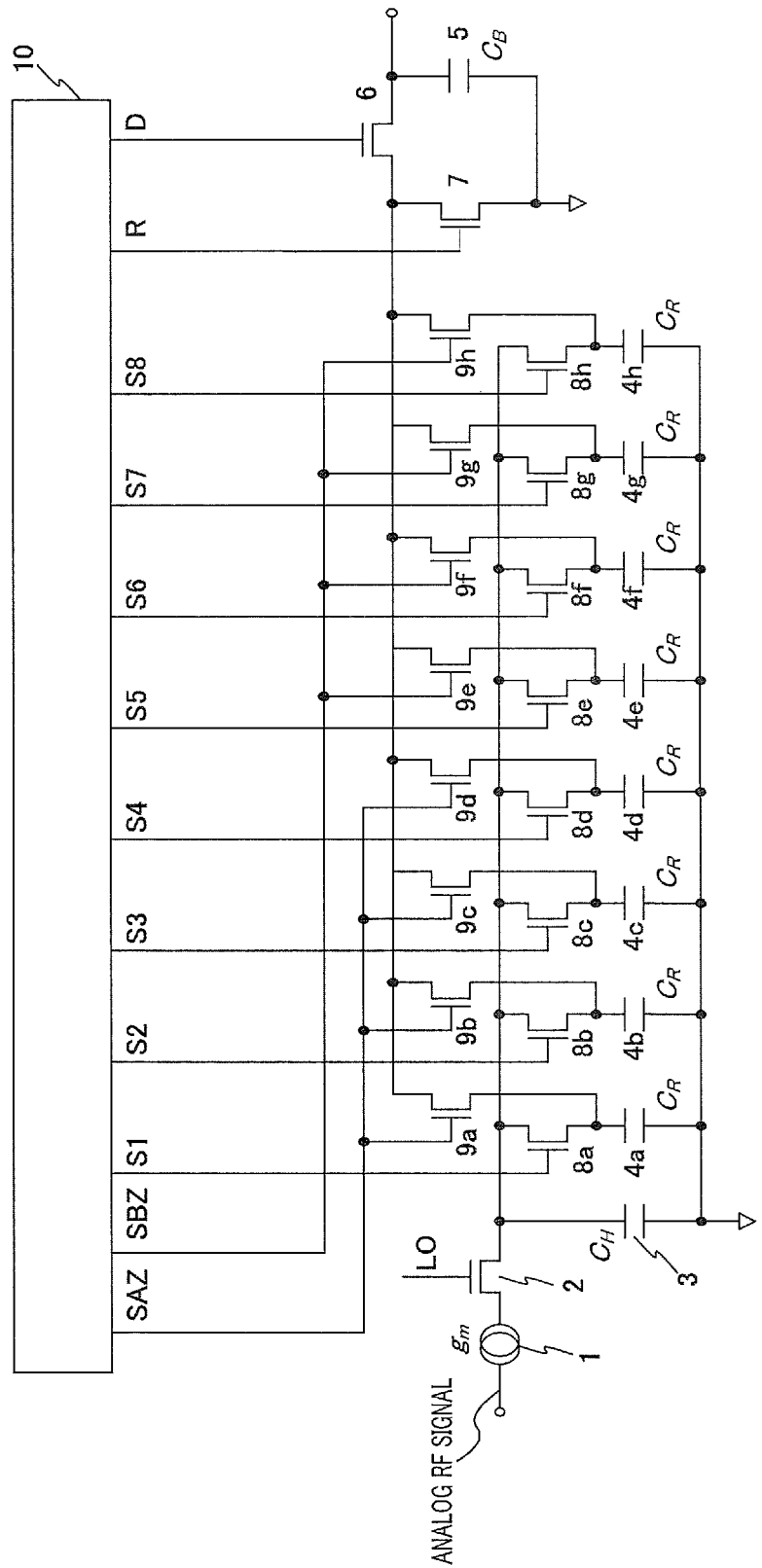
FIG. 1 is a configuration diagram of a direct sampling circuit of conventional configuration 1.
Figure 2:
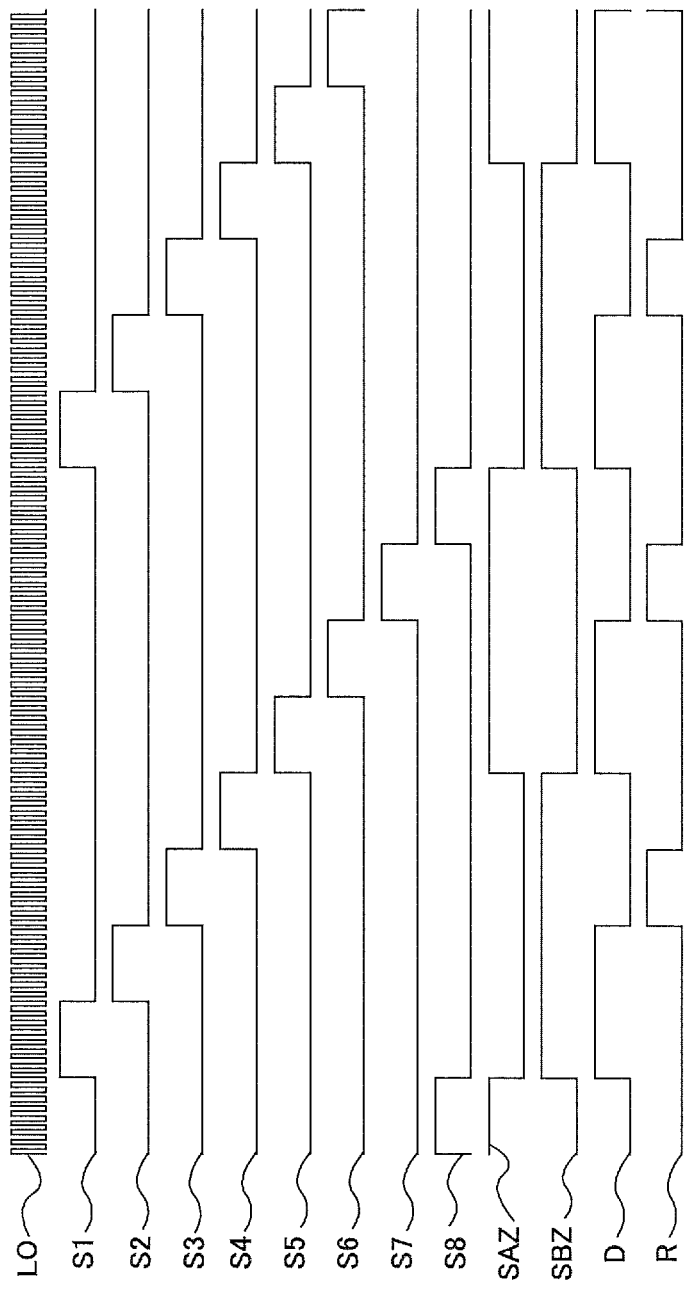
FIG. 2 is a timing chart of control signals inputted to the direct sampling circuit of conventional configuration 1.
Figure 3B:
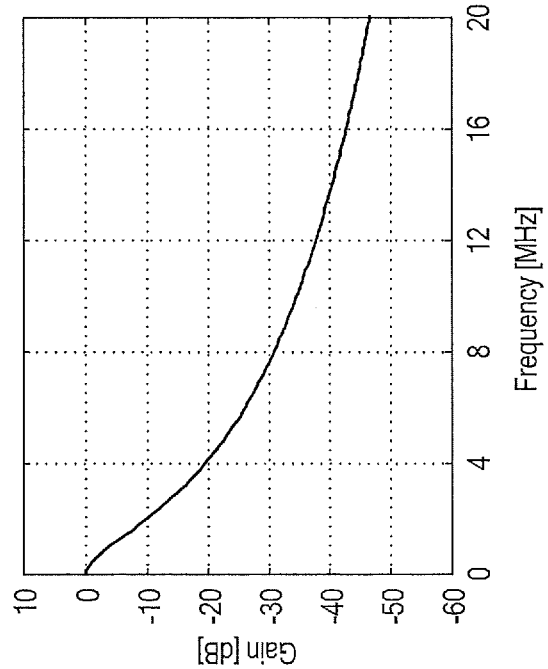
FIGS. 3A and 3B are characteristic diagrams illustrating an example of filter characteristics realized by the direct sampling circuit of conventional configuration 1.
Figure 3A:
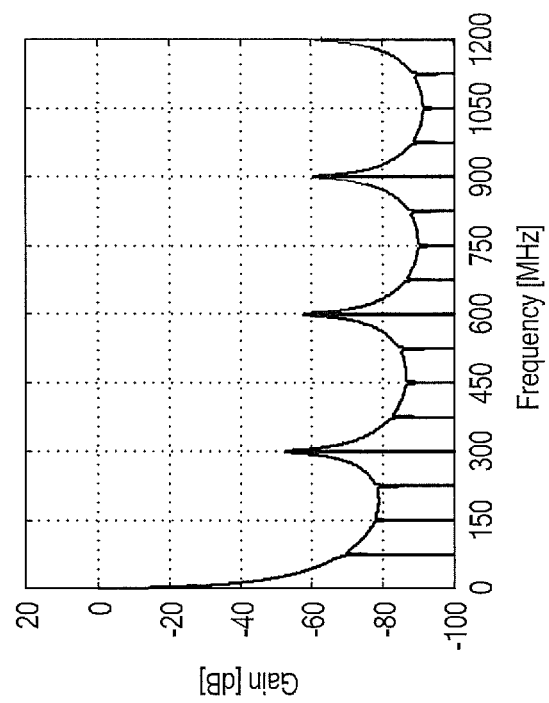
Figure 4:
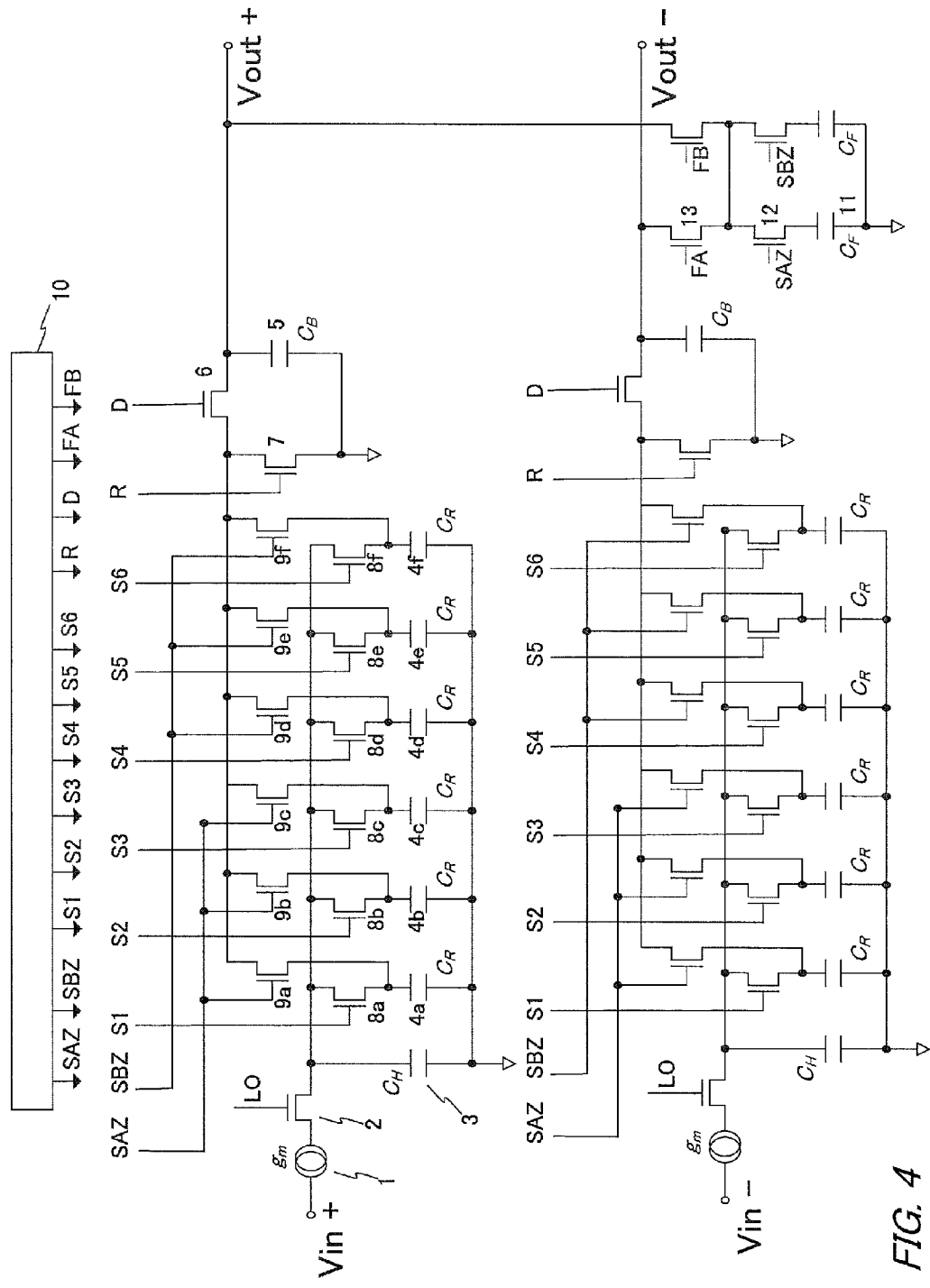
FIG. 4 is a configuration diagram of a direct sampling circuit of conventional configuration 2.
Figure 5:
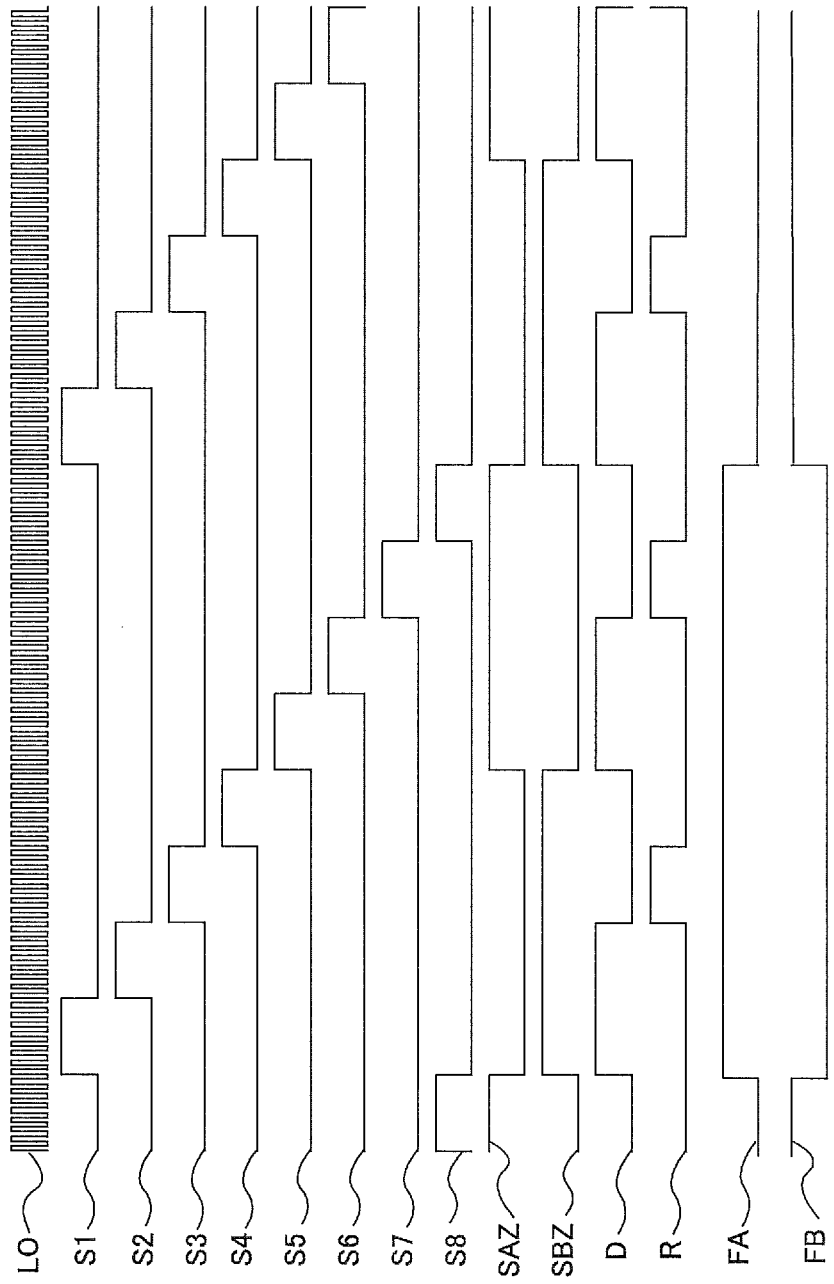
FIG. 5 is a timing chart of control signals inputted to the direct sampling circuit of conventional configuration 2.
Figure 6:
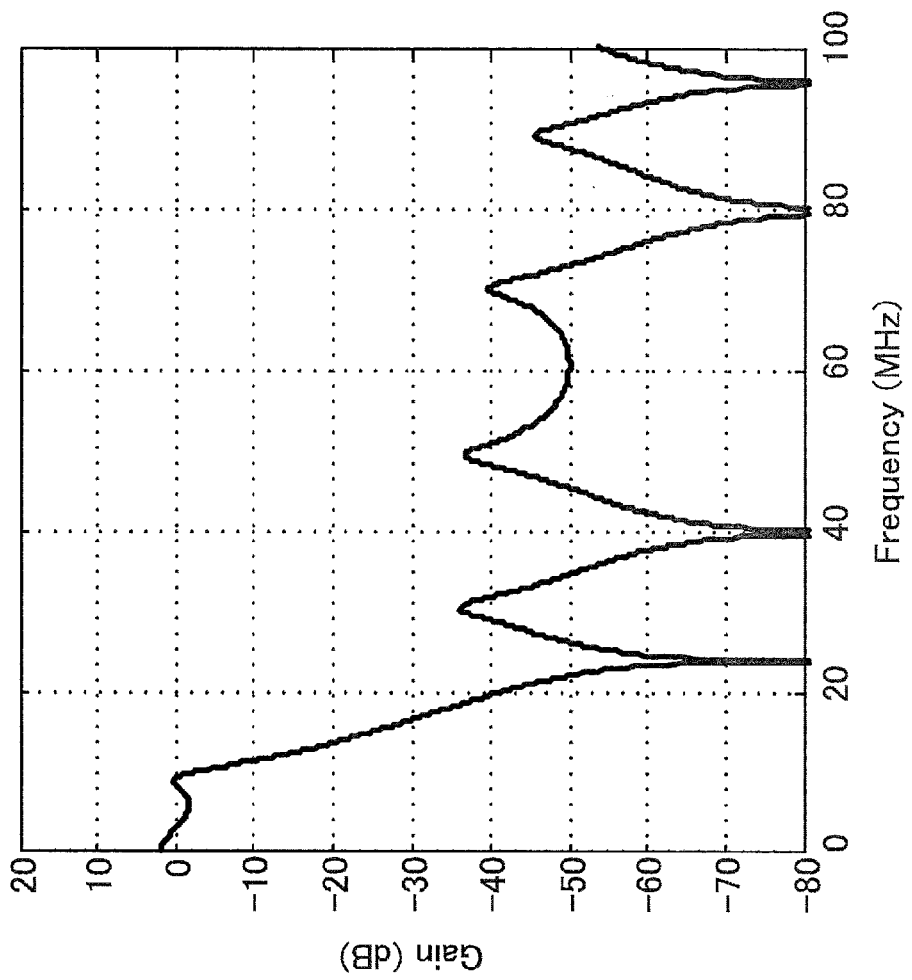
FIG. 6 is a characteristic diagram illustrating an example of filter characteristics realized by the direct sampling circuit of conventional configuration 2.
Figure 7:
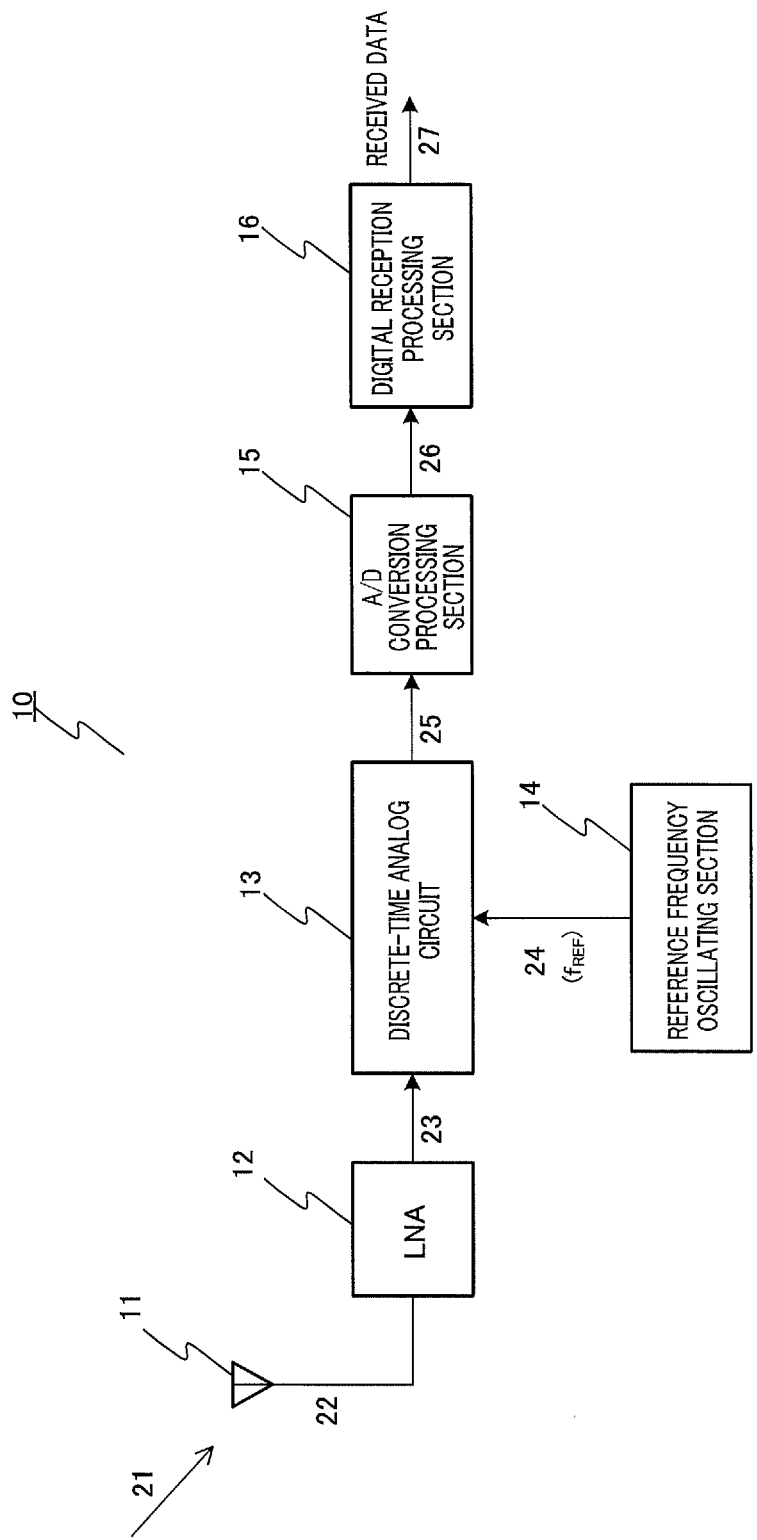
FIG. 7 is a block diagram illustrating a configuration of a direct sampling receiver according to Embodiment 1 of the present invention.

FIG. 7 is a block diagram illustrating a configuration of a direct sampling receiver according to the present embodiment. In FIG. 7, direct sampling receiver 10 includes antenna 11, low noise amplifier (LNA) 12, discrete-time analog circuit 13, reference frequency oscillating section 14, A/D (analog to digital) conversion processing section 15, and digital reception processing section 16.

Direct sampling receiver 10 receives electromagnetic wave 21 transmitted with carrier frequency $f_{CR}$, applies frequency conversion and filter processing to the received signal at discrete-time intervals to extract desired signal components. Direct sampling receiver 10 converts the extracted desired signal components to a digital signal, performs digital reception processing thereon and outputs obtained received data 27.

Direct sampling receiver 10 can be configured as a direct conversion type receiver and can also be configured as a LOW-IF (low intermediate frequency) type receiver. Direct sampling receiver 10 can also be adopted to any one of a plurality of individual receivers constituting a diversity receiver.

Antenna 11 receives electromagnetic wave 21 transmitted with carrier frequency $f_{CR}$ from a transmitting station (not shown) and converts electromagnetic wave 21 to analog RF signal 22. Low noise amplifier 12 amplifies and outputs analog RF signal 22.

Discrete-time analog circuit 13 receives amplified analog RF signal 23 and reference frequency signal 24. Discrete-time analog circuit 13 frequency-converts analog RF signal 23 at discrete-time intervals, and performs filter processing and outputs a baseband signal (or intermediate frequency (IF) signal) 25 from which desired signal component have been thereby extracted.

Reference frequency oscillating section 14 generates reference frequency signal 24 to be used for sampling processing and frequency conversion processing for discrete-time analog circuit 13.

A/D conversion processing section 15 quantizes inputted baseband signal 25 into digital values at a predetermined sampling frequency and outputs digital baseband signal 26 obtained by conversion.

Digital reception processing section 16 performs predetermined digital reception processing such as demodulation processing and decoding processing on inputted digital baseband signal 26 and outputs received data 27. The demodulation processing includes, for example, fast Fourier transform processing on an OFDM (orthogonal frequency division multiplexing) baseband signal.

[Configuration of Discrete-Time Analog Circuit 100]

Figure 8:
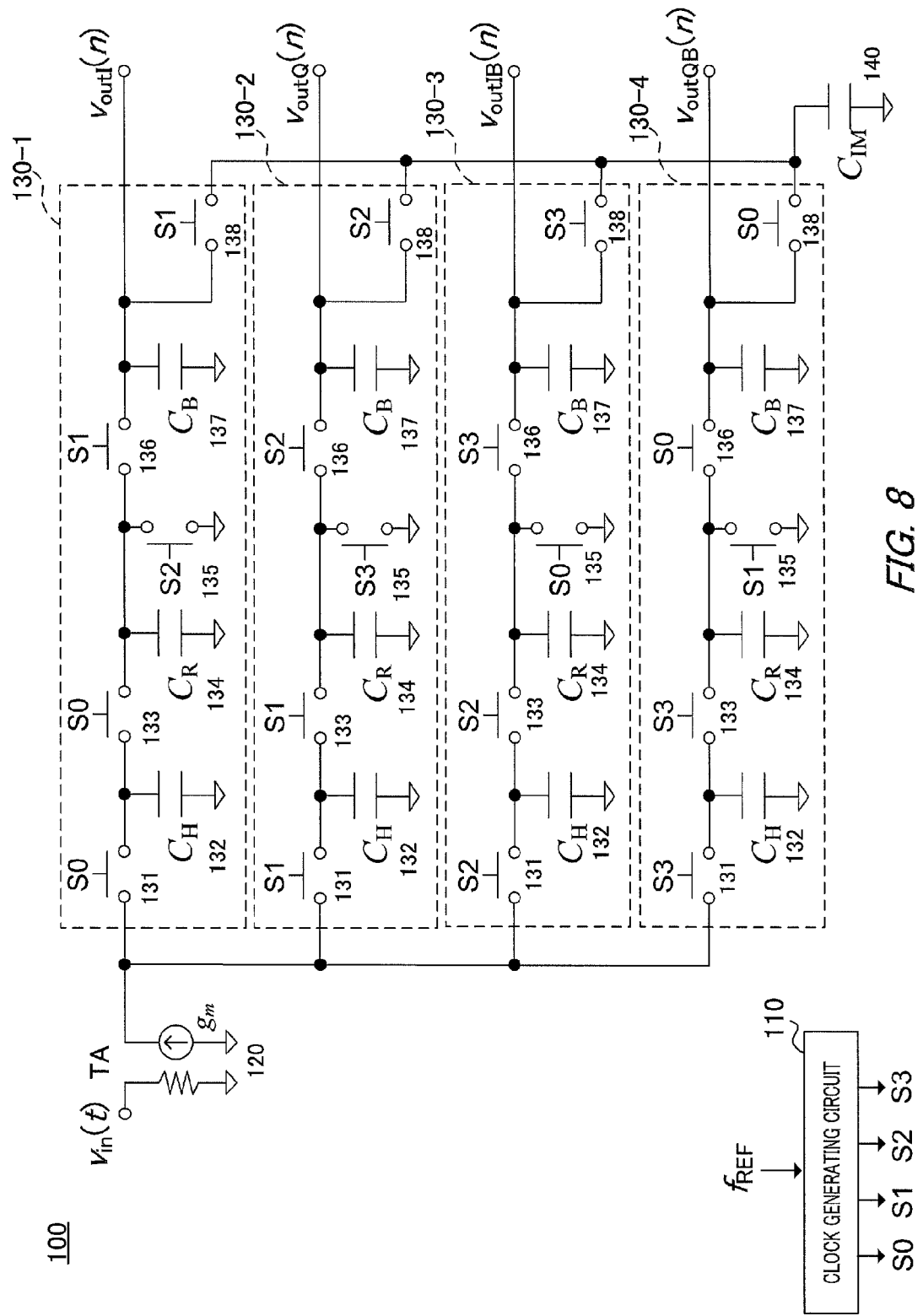
FIG. 8 is a circuit diagram illustrating a configuration of a discrete-time analog circuit according to Embodiment 1 of the present invention.

FIG. 8 is a circuit diagram illustrating an example of main components of discrete-time analog circuit 100 according to present Embodiment 1. Discrete-time analog circuit 100 corresponds to discrete-time analog circuit 13 in FIG. 7 and constitutes a sampling mixer circuit.

Discrete-time analog circuit 100 includes clock generating circuit 110, voltage-to-current conversion circuit (TA: transconductance amplifier, transconductance value=gm) 120, four-system charge sharing circuits 130-1 to 130-4, and imaginary number capacitor (inter-phase capacitor: corresponding to capacitors connected to four-system charge sharing circuits 130-1 to 130-4 via switches) 140. The capacitance value of imaginary number capacitor 140 is represented by $C_{IM}$.

Note that the imaginary number capacitor is a capacitor for realizing an imaginary number unit in a transfer function. In the present invention, since the imaginary number capacitor is connected to four-system charge sharing circuits 130-1 to 130-4 via switches instead of being disposed in an input section immediately after the TA, it is possible to reduce the influence of a parasitic capacitance of the TA. Negative coefficients can be realized by reversing the connection order of four-system charge sharing circuits 130-1 to 130-4.

First charge sharing circuit 130-1 is provided with sampling switch 131 that samples a current signal according to a predetermined phase, history capacitor 132 disposed after the sample switch, charging switch 133 that is switched on at the same timing as the sampling switch, rotating capacitor 134 disposed after the charging switch, reset switch 135 that connects the rotating capacitor to the ground, dump switch 136 that connects the rotating capacitor and the buffer capacitor, buffer capacitor 137 that determines the potential of the output section by means of charge sharing with the rotating capacitor, and charge sharing switch 138 that connects the buffer capacitor and the inter-phase capacitor (inter-phase charge sharing switch: corresponding to a switch that controls charge sharing with charge stored in the inter-phase capacitor, charge stored in the capacitor in the charge sharing circuit of the I-phase, IB-phase, Q-phase and QB-phase). Capacitance values of history capacitor 132, rotating capacitor 134 and buffer capacitor 137 are represented by $C_H$, $C_R$ and $C_B$ respectively.

Charge is shared between I-phases and between Q-phases, and an imaginary number unit can be realized in a transfer function by connecting between phases via an inter-phase charge sharing switch.

In charge sharing circuit 130-1, sampling switch 131 and charging switch 133 are switched on simultaneously. Thus, the input node of charge sharing circuit 130-1 becomes one end of history capacitor 132 and one end of rotating capacitor 134, whereby a current is inputted from voltage-to-current conversion circuit 120.

Second to fourth charge sharing circuits 130-2 to 130-4 have different combinations of control signals S0 to S3 inputted to the respective switches but are the same as first charge sharing circuit 130-1 in the rest of the configuration.

That is, since four-system charge sharing circuits 130-1 to 130-4 have different combinations of control signals S0 to S3, currents are inputted from voltage-to-current conversion circuit 120 at timings shifted by ¼ cycles from one another in order of the first, second, third and fourth lines. Four-system charge sharing circuits 130-1 to 130-4 are connected to imaginary number capacitor 140 at timings shifted by ¼ cycles from one another in order of the first, second, third and fourth lines.

[Operation of Discrete-Time Analog Circuit 100]

Figure 9:
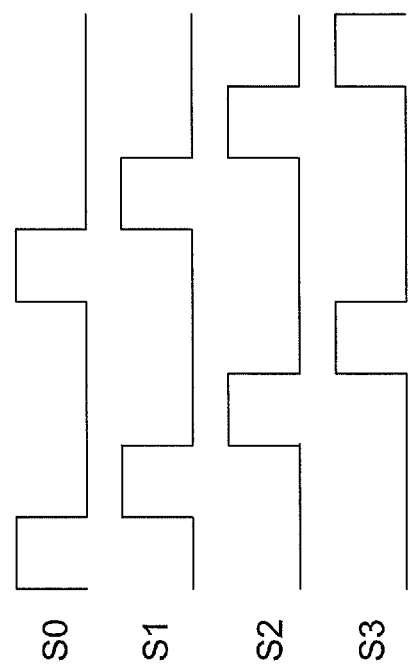
FIG. 9 is a timing chart of control signals inputted to the discrete-time analog circuit according to Embodiment 1 of the present invention.

FIG. 9 is a timing chart of control signals inputted to the discrete-time analog circuit according to Embodiment 1 of the present invention.

Clock generating circuit 110 generates control signals S0, S1, S2 and S3 shown in FIG. 9 using reference frequency signal 24 generated in reference frequency oscillating section 14 and supplies the control signals to the respective switches. Control signals S0, S1, S2 and S3 are signals with phases shifted by 90° by a clock with frequency $f_{LO}$ generated with reference to frequency $f_{REF}$. Frequency $f_{LO}$ becomes carrier frequency $f_{CR}$ when discrete-time analog circuit 13 outputs a baseband signal. When discrete-time analog circuit 13 outputs an intermediate frequency signal, frequency $f_{LO}$ becomes frequency $f_{CR}-f_{IF}$ or $f_{CR}+f_{IF}$, which is a difference between carrier frequency $f_{CR}$ and intermediate frequency $f_{IF}$.

Voltage-to-current conversion circuit 120 converts analog RF signal 23 amplified in low noise amplifier 12 as an input voltage signal ($v_{in}$) to a current (input current signal: gm×$v_{in}$).

First, an operation of first charge sharing circuit 130-1 will be described as a representative.

Sampling switch 131 is connected to the output of voltage-to-current conversion circuit 120 and is switched on while control signal S0 supplied from clock generating circuit 110 is high. Here, control signal S0 is a signal with a frequency that matches carrier frequency $f_{CR}$ of analog RF signal 23 in direct conversion. That is, frequency $f_{LO}$ of control signals S0 to S3 becomes carrier frequency $f_{CR}$ of the input signal. When an IF frequency is used, control signal S0 is a signal with a frequency by IF frequency $f_{IF}$ shifted from carrier frequency $f_{CR}$ ($f_{LO}=f_{CR}\pm f_{IF}$).

While control signal S0 is high, charging switch 133 is also simultaneously on, and therefore the analog RF input signal converted to a current in voltage-to-current conversion circuit 120 is stored as charge in history capacitor 132 and rotating capacitor 134. Thus, the input signal becomes a discrete-time analog sample value and is converted from a radio frequency to a baseband (BB) frequency. Since history capacitor 132 stores charge one cycle ahead, IIR filtering is performed through charge sharing. This operation can be described using a difference equation by the following equation.

[2]

$$q_{in}=g_m\int_0^{T_{LO}/4} v_{in}(t)\exp(j\omega t)dt \approx g_m v_{in}(n)\int_0^{T_{LO}/4}\exp(j\omega t)dt$$

$$q_{in}(n)+C_H v_1(n-1)=(C_R+C_H)v_1(n) \quad \text{(Equation 2)}$$

Here, $q_{in}$ is charge inputted while control signal S0 is high, $T_{LO}$ is a cycle of control signal S0 (=1/$f_{LO}$), and $v_{in}(t)$ is an input voltage at time t. In addition, $v_1$ is a potential on one end side of history capacitor 132. The function with an integer value (e.g., n, n−1) as an argument represents a representative value for each cycle $T_{LO}$ of the function. The same applies to the following equations.

Next, while control signal S1 is high, rotating capacitor 134, buffer capacitor 137 and imaginary number capacitor 140 share charge via charge sharing switch 138. That is, since buffer capacitor 137 stores charge one cycle ahead and imaginary number capacitor 140 stores charge ¼ cycles ahead, complex filtering is performed. This operation can be described by the following equation.

[3]

$$C_R v_1(n)+C_B v_{out}(n-1)+jC_{IM}v_{out}(n)=(C_R+C_B+C_{IM})v_{out}(n) \quad \text{(Equation 3)}$$

Here, output potential $v_{out}$ represents a potential on one end side of buffer capacitor 137 and corresponds to $v_{out}1$ in FIG. 8.

Finally, while control signal S2 is high, rotating capacitor 134 is connected to a reference potential via reset switch 135, and the charge stored in rotating capacitor 134 is discharged. The timing at which the reset switch is switched on may be the timing of control signal S3.

The above-described operation is repeated in first charge sharing circuit 130-1. By z-converting input/output and calculating a ratio between z-converted input/output Vout(z) and Vin(z), an overall transfer function can be calculated. The transfer function is given by the following equation.

[4]

$$H(z) \approx \frac{g_m T_{LO}}{\sqrt{2}\pi} \cdot \frac{1}{C_R + C_H(1-z^{-1})} \cdot \frac{C_R}{C_R + C_B(1-z^{-1}) + C_{IM}(1-j)} \quad \text{(Equation 4)}$$

In charge sharing circuit 130-1, it is possible to realize a complex type transfer function having imaginary number unit "j" in the transfer function.

In second to fourth charge sharing circuits 130-2 to 130-4, similar operation is repeated at timings shifted by ¼ cycles from one another. In second to fourth charge sharing circuits 130-2 to 130-4, $v_{out}$ in equation 3 corresponds to $v_{out}Q$, $v_{out}IB$ and $v_{out}QB$ in FIG. 8 and the transfer function likewise becomes equation 4.

Figure 10:
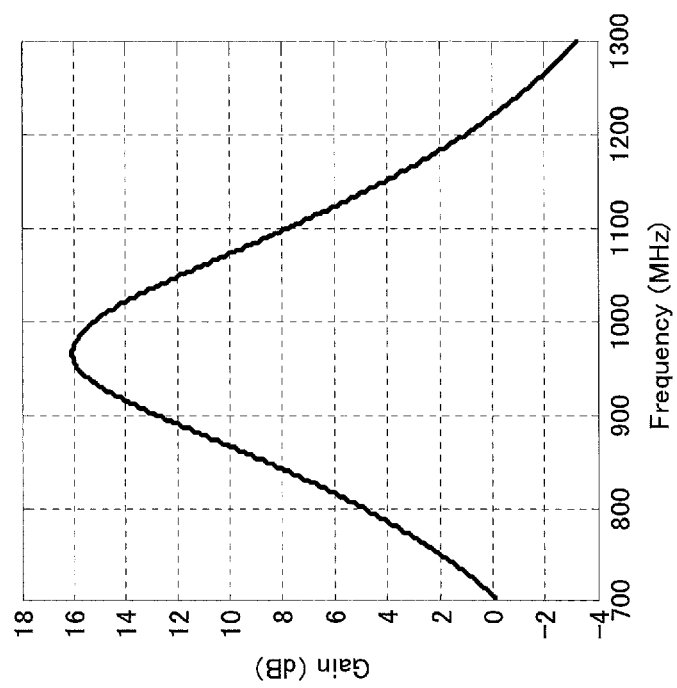
FIG. 10 is a characteristic diagram illustrating an example of filter characteristics realized by the discrete-time analog circuit according to Embodiment 1 of the present invention.

FIG. 10 is a characteristic diagram illustrating an example of filter characteristics realized by the discrete-time analog circuit according to Embodiment 1 of the present invention.

FIG. 10 shows an example of frequency characteristics of a conversion gain when $f_{LO}$=1 GHz, gm=10 mS, $C_H$=100 fF, $C_R$=100 fF, $C_B$=1 pF and $C_{IM}$=500 fF. The horizontal axis shows an input frequency of a radio signal and the vertical axis shows a conversion gain. In discrete-time analog circuit 100 of Embodiment 1, a characteristic is obtained which corresponds to the characteristic curve of the transfer function ($C_{IM}$=0 in equation 4) of the conventional real number coefficient shifted leftward.

Discrete-time analog circuit 100 of Embodiment 1 has a configuration in which imaginary number capacitor 140 is connected to nodes other than the input nodes of respective charge sharing circuits 130-1 to 130-4. More specifically, a configuration is adopted in which imaginary number capacitor 140 is connected to the output nodes of respective charge sharing circuits 130-1 to 130-4. For this reason, it is possible to reduce the influence of a parasitic capacitance of voltage-to-current conversion circuit 120 and accurately share charge among charge sharing circuits 130-1 to 130-4 via imaginary number capacitor 140 with the current input cycle shifted by ¼ cycles.

Embodiment 2

Configuration of Discrete-Time Analog Circuit 200

Figure 11:
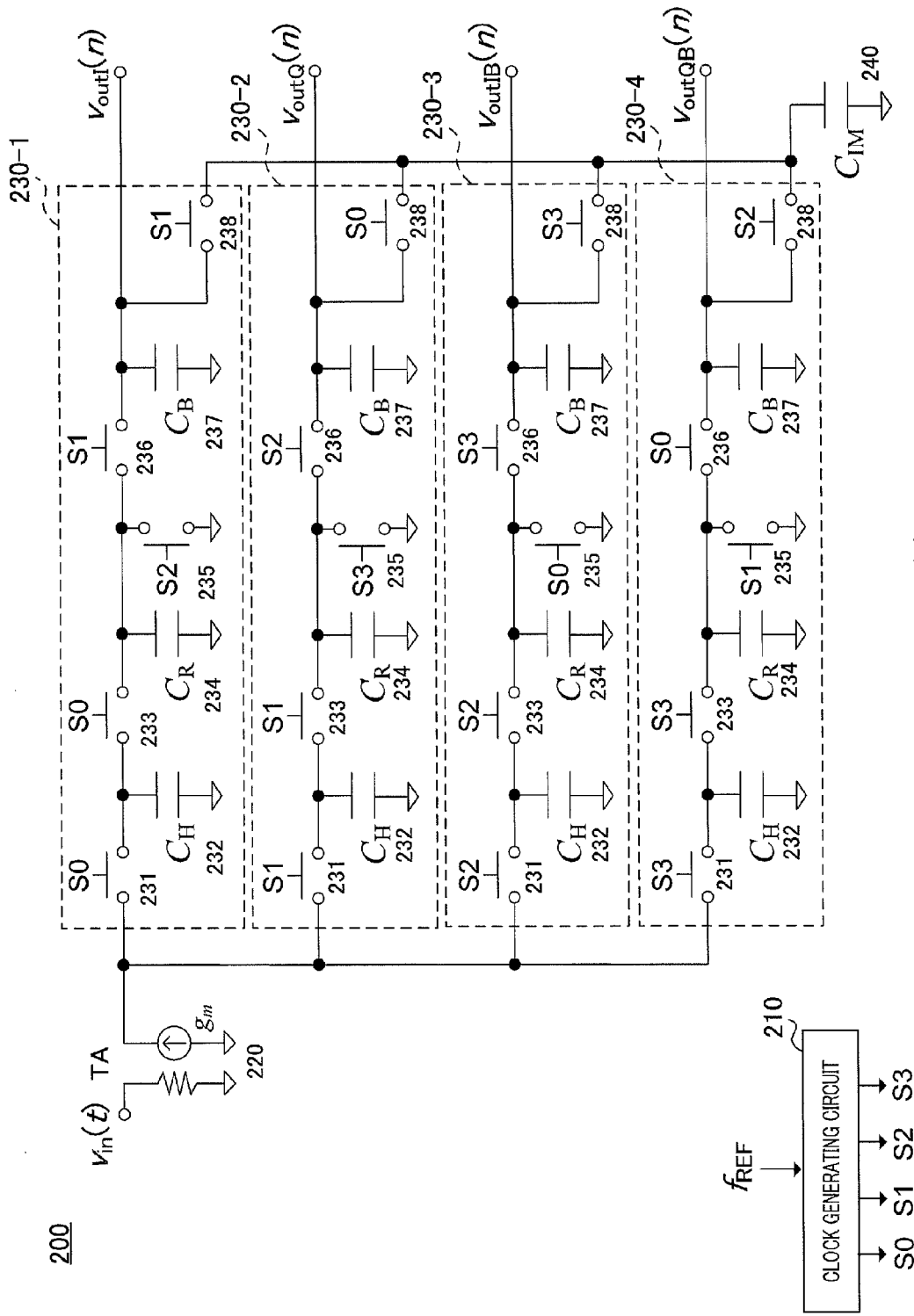
FIG. 11 is a circuit diagram illustrating a configuration of a discrete-time analog circuit according to Embodiment 2 of the present invention.

FIG. 11 is a block diagram illustrating an example of a configuration of main components of discrete-time analog circuit 200 according to present Embodiment 2. Discrete-time analog circuit 200 corresponds to discrete-time analog circuit 13 in FIG. 7 and constitutes a sampling mixer circuit.

Discrete-time analog circuit 200 of Embodiment 2 includes clock generating circuit 210, voltage-to-current conversion circuit (TA: transconductance amplifier, tranconductance value=gm) 220, four-system charge sharing circuits 230-1 to 230-4, and imaginary number capacitor 240. The capacitance value of imaginary number capacitor 240 is represented by $C_{IM}$.

First charge sharing circuit 230-1 includes sampling switch 231, history capacitor 232, charging switch 233, rotating capacitor 234, reset switch 235, dump switch 236, buffer capacitor 237, and charge sharing switch 238. The capacitance values of history capacitor 232, rotating capacitor 234, and buffer capacitor 237 are represented by $C_H$, $C_R$, and $C_B$ respectively. Clock generating circuit 210 generates control signals S0, S1, S2 and S3 shown in FIG. 9 and supplies the control signals to the respective switches.

Second to fourth charge sharing circuits 230-2 to 230-4 operate with their cycles shifted by ¼ from first charge sharing circuit 230-1 respectively by changing combinations of control signals S0 to S3 inputted to the respective switches. The rest of the configuration is the same as that of first charge sharing circuit 230-1.

That is, since combinations of control signals S0 to S3 are different among four-system charge sharing circuits 230-1 to 230-4, a current from voltage-to-current conversion circuit 220 is inputted at timings shifted by ¼ cycles from one another in order of the first, second, third and fourth lines. Four-system charge sharing circuits 230-1 to 230-4 are connected to imaginary number capacitor 240 at timings shifted by ¼ cycles from one another in order of the fourth, third, second and first lines, that is, in reverse order. That is, charge sharing circuits 230-1 to 230-4 each share charge with other charge sharing circuits 230-1 to 230-4 whose current input phase is different by −90° (=270°) via imaginary number capacitor 240.

[Operation of Discrete-Time Analog Circuit 200]

Since discrete-time analog circuit 200 of Embodiment 2 operates substantially in the same way as discrete-time analog circuit 100 of Embodiment 1, the operation thereof will be described focusing on differences from Embodiment 1.

The difference between discrete-time analog circuit 100 and discrete-time analog circuit 200 lies in a control signal inputted to charge sharing switch 238. In discrete-time analog circuit 100, sampling switch 131 and charge sharing switch 138 are controlled by the same control signal (one of control signals S0 to S3). That is, the order in which sampling switch 231 is switched on is the same as the order in which charge sharing switch 238 is switched on.

On the other hand, in discrete-time analog circuit 200, the order in which sampling switch 231 in first to fourth charge sharing circuits 230-1 to 230-4 is switched on is reverse to the order in which charge sharing switch 238 is switched on. In this way, an equation of charge sharing among rotating capacitor 234, buffer capacitor 237 and imaginary number capacitor 240 is shown below.

[5]

$$C_R v_1(n) + C_B v_{out}(n-1) - jC_{IM}v_{out}(n) = (C_R + C_B + C_{IM})v_{out}(n) \quad \text{(Equation 5)}$$

The overall transfer function of discrete-time analog circuit 200 is shown below.

[6]

$$H(z) \approx \frac{g_m T_{LO}}{\sqrt{2}\pi} \cdot \frac{1}{C_R + C_H(1-z^{-1})} \cdot \frac{C_R}{C_R + C_B(1-z^{-1}) + C_{IM}(1+j)} \quad \text{(Equation 6)}$$

Discrete-time analog circuit 200 allows a transfer function with the reversed sign of imaginary number unit (j) to be realized with respect to discrete-time analog circuit 100 of Embodiment 1.

Figure 12:
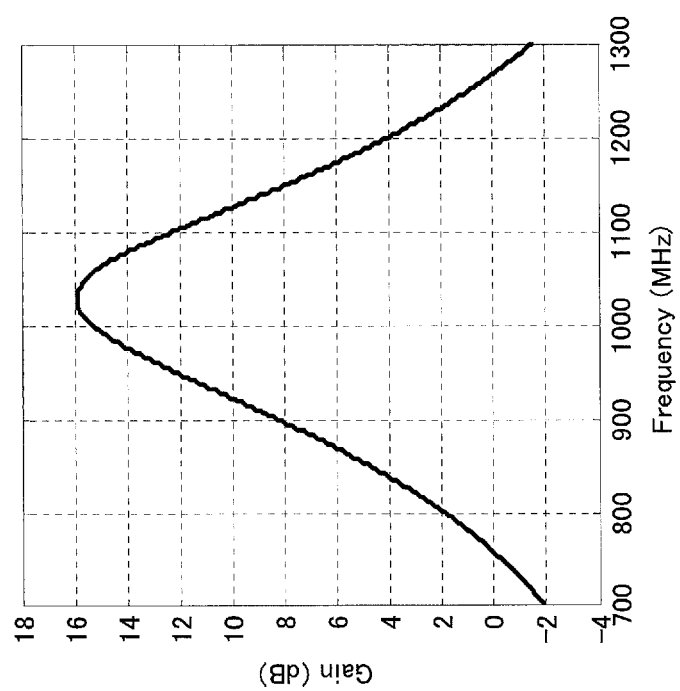
FIG. 12 is a characteristic diagram illustrating an example of filter characteristics realized by the discrete-time analog circuit according to Embodiment 2 of the present invention.

FIG. 12 is a characteristic diagram illustrating an example of filter characteristics realized by the discrete-time analog circuit according to Embodiment 2 of the present invention.

FIG. 12 shows an example of frequency characteristics of a conversion gain when $f_{LO}$=1 GHz, gm=10 mS, $C_H$=100 fF, $C_R$=100 fF, $C_B$=1 pF, and $C_{IM}$=500 fF. The horizontal axis shows an input frequency of a radio signal and the vertical axis shows a conversion gain. In discrete-time analog circuit 200 of Embodiment 2, a characteristic is obtained which corresponds to the characteristic curve of the transfer function ($C_{IM}$=0 in equation 4) of the conventional real number coefficient shifted rightward.

Discrete-time analog circuit 200 of Embodiment 2 has a configuration in which imaginary number capacitor 240 is connected to nodes other than the input nodes of respective charge sharing circuits 230-1 to 230-4. More specifically, a configuration is adopted in which imaginary number capacitor 240 is connected to the output nodes of respective charge sharing circuits 230-1 to 230-4. For this reason, it is possible to reduce the influence of parasitic capacitance of voltage-to-current conversion circuit 220 and accurately share charge among charge sharing circuits 230-1 to 230-4 via imaginary number capacitor 240 with the current input cycle shifted by ¼ cycles.

Note that in first charge sharing circuit 230-1 and third charge sharing circuit 230-3, rotating capacitor 234, buffer capacitor 237 and imaginary number capacitor 240 are simultaneously connected. These operations are substantially the same as the operation of charge sharing circuit 130-1 of Embodiment 1, and the difference lies in that the sign of charge stored in imaginary number capacitor 240 is reversed. Thus, the transfer function is obtained by equation 6.

On the other hand, in second charge sharing circuit 230-2 and fourth charge sharing circuit 230-4, rotating capacitor 234, buffer capacitor 237 and imaginary number capacitor 240 are connected at staggered timings. These operations are not the same as the operation of charge sharing circuit 130-1 of Embodiment 1. However, under a condition of $C_B \gg C_R$, the transfer function thereof is approximated to that when those capacitors are connected simultaneously.

Here, when rotating capacitor 234, buffer capacitor 237 and imaginary number capacitor 240 are not simultaneously connected, the respective potentials after charge sharing can be described by the following equation.

[7]

$$\begin{cases} C_R V_1 + C_B V_3 z^{-1} = (C_R + C_B) V_2 \\ C_B V_2 + jC_{IM} V_3 = (C_B + C_{IM}) V_3 \end{cases}$$ (Equation 7)

$V_2$ denotes a potential after charge sharing between rotating capacitor 234 and buffer capacitor 237 and $V_3$ denotes a potential after charge sharing between buffer capacitor 237 and imaginary number capacitor 240.

Equation 7 is converted into the following equation.

[8]

$$C_R V_1 = \frac{C_B}{C_B + C_{IM}(1-j)} \left( C_R + \frac{(C_R + C_B)C_{IM}}{C_B}(1-j) + C_B(1-z^{-1}) \right) V_2$$ (Equation 8)

$$\approx (C_R + C_B(1-z^{-1}) + C_{IM}(1-j))V_2 \quad (\because C_B \gg C_R)$$

That is, Equation 7 becomes the same equation as the one applicable to a case where rotating capacitor 234, buffer capacitor 237 and imaginary number capacitor 240 are simultaneously connected.

Therefore, the transfer function of Embodiment 2 becomes equation 6 in which the sign of charge stored in imaginary number capacitor 240 is reversed in the transfer function of Embodiment 1.

In an analog simulation of the electronic circuit, filter characteristics are obtained in which a central passband frequency is shifted rightward in accordance with capacitance value $C_{IM}$ of imaginary number capacitor 240 as the characteristic of discrete-time analog circuit 200 of Embodiment 2 in FIG. 12.

Embodiment 3

Configuration of Discrete-Time Analog Circuit 300

Figure 13:
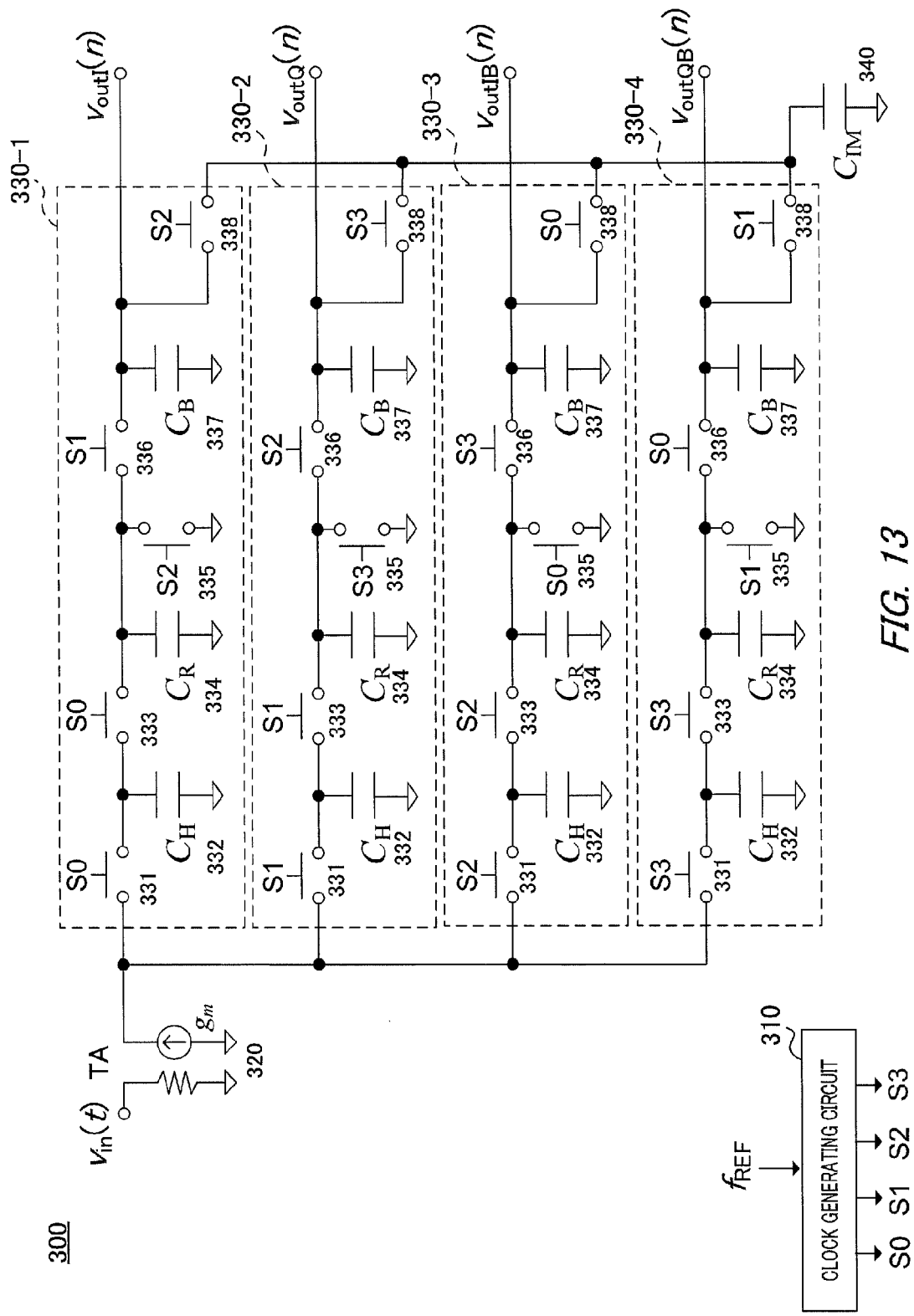
FIG. 13 is a circuit diagram illustrating a configuration of a discrete-time analog circuit according to Embodiment 3 of the present invention.

FIG. 13 is a block diagram illustrating an example of main components of discrete-time analog circuit 300 according to present Embodiment 3. Discrete-time analog circuit 300 corresponds to discrete-time analog circuit 13 in FIG. 7 and constitutes a sampling mixer circuit.

Discrete-time analog circuit 300 of Embodiment 3 includes clock generating circuit 310, voltage-to-current conversion circuit (TA: transconductance amplifier, transconductance value=gm) 320, four-system charge sharing circuits 330-1 to 330-4, and imaginary number capacitor 340. The capacitance value of imaginary number capacitor 340 is represented by $C_{IM}$.

Four-system charge sharing circuits 330-1 to 330-4 each include sampling switch 331, history capacitor 332, charging switch 333, rotating capacitor 334, reset switch 335, dump switch 336, buffer capacitor 337, and charge sharing switch 338. The capacitance values of history capacitor 332, rotating capacitor 334, and buffer capacitor 337 are represented by $C_H$, $C_R$, and $C_B$, respectively. Clock generating circuit 310 generates control signals S0, S1, S2 and S3 shown in FIG. 9 and supplies the control signals to the respective switches.

That is, since combinations of control signals S0 to S3 are different among four-system charge sharing circuits 330-1 to 330-4, currents are inputted from voltage-to-current conversion circuit 320 at timings shifted by ¼ cycles from one another in order of the first, second, third and fourth lines. Four-system charge sharing circuits 330-1 to 330-4 are connected to imaginary number capacitor 340 at timings shifted by ¼ cycles from one another in order of the first, second, third and fourth lines.

Discrete-time analog circuit 300 of Embodiment 3 is different from discrete-time analog circuit 100 of Embodiment 1 in the connection order of control signals (control signals S0, S1, S2 and S3) that control charge sharing switches 338. Discrete-time analog circuit 300 of Embodiment 3 adopts a configuration in which dump switch 336 and charge sharing switch 338 are switched on at different timings.

[Operation of Discrete-Time Analog Circuit 300]

In four-system charge sharing circuits 330-1 to 330-4, rotating capacitor 334, buffer capacitor 337 and imaginary number capacitor 340 are connected at staggered timings. Thus, four-system charge sharing circuits 330-1 to 330-4 operate in a way different from charge sharing circuit 130-1 of Embodiment 1.

However, as described using equation 7 and equation 8, the transfer function when the capacitors are connected at staggered timings is approximate to the transfer function when the capacitors are connected simultaneously under a condition of $C_B \gg C_R$.

Therefore, the transfer function of charge sharing circuits 330-1 to 330-4 of Embodiment 3 can be approximated to the transfer function of Embodiment 1. Thus, as a characteristic of discrete-time analog circuit 300 of Embodiment 3, it is possible to realize filter characteristics with the central passband frequency shifted leftward in accordance with capacitance value $C_{IM}$ of imaginary number capacitor 340 in FIG. 10.

Embodiment 4

Configuration of Discrete-Time Analog Circuit 400

Figure 14:
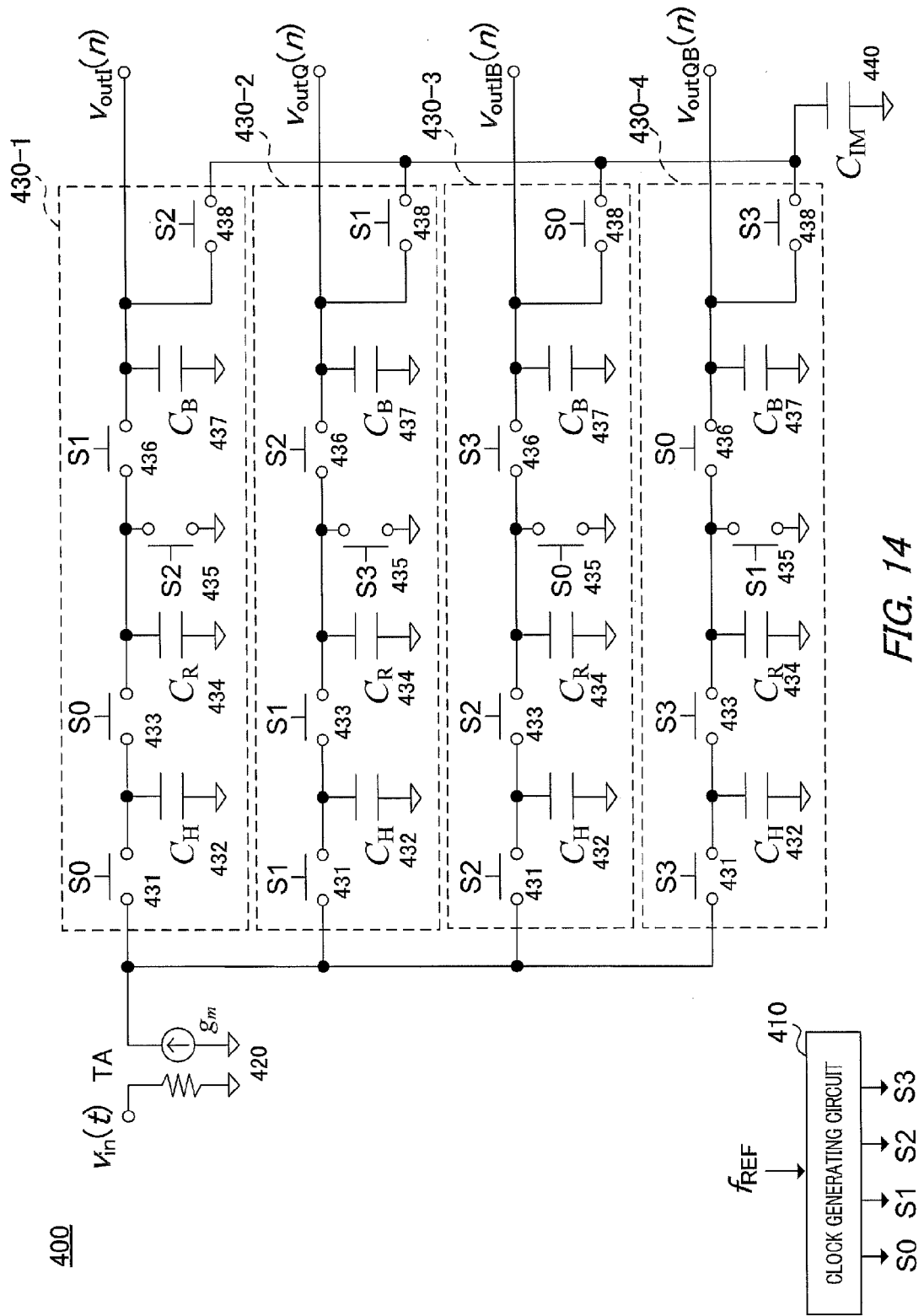
FIG. 14 is a circuit diagram illustrating a configuration of a discrete-time analog circuit according to Embodiment 4 of the present invention.

FIG. 14 is a block diagram illustrating an example of main components of discrete-time analog circuit 400 according to the present embodiment 4. Discrete-time analog circuit 400 corresponds to discrete-time analog circuit 13 in FIG. 7 and constitutes a sampling mixer circuit.

Discrete-time analog circuit 400 of Embodiment 4 includes clock generating circuit 410, voltage-to-current conversion circuit (TA: transconductance amplifier, transconductance value=gm) 420, four-system charge sharing circuits 430-1 to 430-4, and imaginary number capacitor 440. The capacitance value of imaginary number capacitor 440 is represented by $C_{IM}$.

Four-system charge sharing circuits 430-1 to 430-4 each include sampling switch 431, history capacitor 432, charging switch 433, rotating capacitor 434, reset switch 435, dump switch 436, buffer capacitor 437, and charge sharing switch 438. The capacitance values of history capacitor 432, rotating capacitor 434, and, buffer capacitor 437 are represented by $C_H$, $C_R$, and $C_B$ respectively. Clock generating circuit 410 generates control signals S0, S1, S2 and S3 shown in FIG. 9 and supplies the control signals to the respective switches.

That is, since combinations of control signals S0 to S3 are different among four-system charge sharing circuits 430-1 to 430-4, currents are inputted from voltage-to-current conversion circuit 420 at timings shifted by ¼ cycles from one another in order of the first, second, third and fourth lines. Four-system charge sharing circuits 430-1 to 430-4 are connected to imaginary number capacitor 440 at timings shifted by ¼ cycles from one another in order of the fourth, third, second and first systems, that is, in the reverse order.

Discrete-time analog circuit 400 of Embodiment 4 is different from discrete-time analog circuit 200 of Embodiment 2 in the connection order of control signals (control signals S0, S1, S2 and S3) that control charge sharing switches 438. Discrete-time analog circuit 400 of Embodiment 4 adopts a configuration in which dump switch 436 and charge sharing switch 438 are switched on at different timings in all charge sharing circuits 430-1 to 430-4.

[Operation of Discrete-Time Analog Circuit 400]

In four-system charge sharing circuits 430-1 to 430-4, rotating capacitor 434, buffer capacitor 437 and imaginary number capacitor 440 are connected at staggered timings, that is, dump switch 436 and charge sharing switch 438 are connected without being simultaneously switched on. The transfer function in this case is approximated to a transfer function when capacitors are simultaneously connected under the condition of $C_B \gg C_R$ as described using equation 7 and equation 8.

A difference of discrete-time analog circuit 400 from discrete-time analog circuit 300 is that the connection order of control signals inputted to charge sharing switch 438 is reverse. In discrete-time analog circuit 300, charge by 90 degrees ahead is stored in charge sharing imaginary number capacitor 340 as an initial value of charge sharing with the imaginary number capacitor. In contrast, in discrete-time analog circuit 400, charge by 270 degrees ahead is stored in imaginary number capacitor 440 as an initial value of charge sharing with imaginary number capacitor 440.

Charge sharing can be described by the following equation.

[9]

$$C_R v_1(n) + C_B v_{out}(n-1) + jC_{IM} v_{out}(n) = (C_R + C_B + C_{IM}) v_{out}(n) \quad \text{(Equation 9)}$$

Thus, the transfer function of entire discrete-time analog circuit 400 is shown below.

[10]

$$H(z) \approx \frac{g_m T_{LO}}{\sqrt{2}\pi} \cdot \frac{1}{C_R + C_H(1-z^{-1})} \cdot \frac{C_R}{C_R + C_B(1-z^{-1}) + C_{IM}(1-j)} \quad \text{(Equation 10)}$$

Therefore, the transfer functions of charge sharing circuits 430-1 to 430-4 of Embodiment 4 can be approximated to the transfer function of Embodiment 2. Thus, as characteristics of discrete-time analog circuit 400 of Embodiment 4, it is possible to realize filter characteristics with a central passband frequency shifted rightward in accordance with capacitance value $C_{IM}$ of imaginary number capacitor 440 in FIG. 12.

Embodiment 5

Configuration of Discrete-Time Analog Circuit 500

Figure 15:
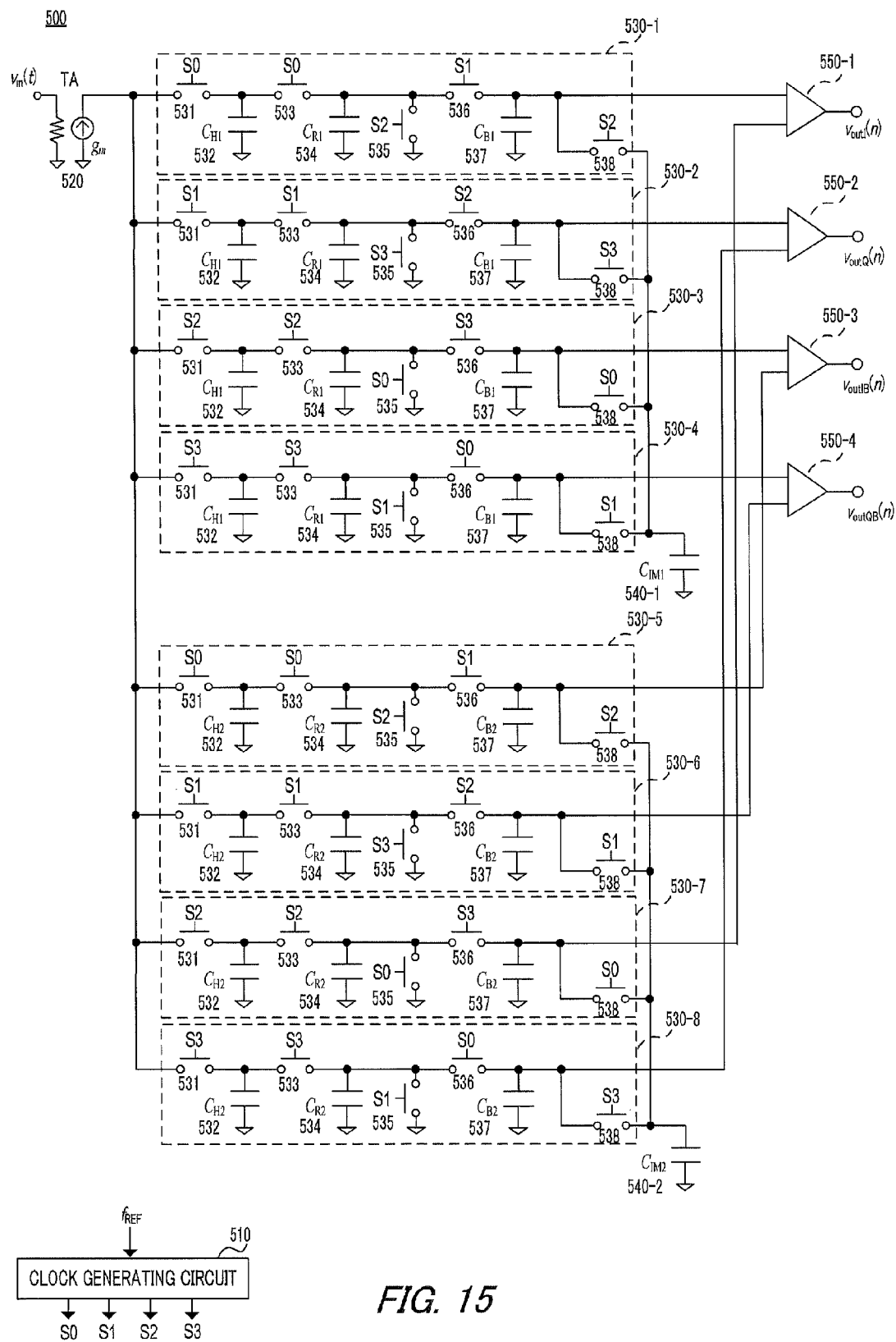
FIG. 15 is a circuit diagram illustrating a configuration of a discrete-time analog circuit according to Embodiment 5 of the present invention.

FIG. 15 is a block diagram illustrating an example of main components of discrete-time analog circuit 500 according to present Embodiment 5. Discrete-time analog circuit 500 corresponds to discrete-time analog circuit 13 in FIG. 7 and constitutes a sampling mixer circuit.

Discrete-time analog circuit 500 includes clock generating circuit 510, voltage-to-current conversion circuit (TA: transconductance amplifier, transconductance value=gm) 520, two sets of four-system charge sharing circuits 530-1 to 530-8, imaginary number capacitor 540-1 and 540-2, and differential amplifiers 550-1 to 550-4.

Here, four-system charge sharing circuits 530-1 to 530-4 on the first side and one imaginary number capacitor 540-1 connected thereto correspond to a passive switched capacitor circuit of the first set. Four-system charge sharing circuits 530-5 to 530-8 on the second set side and one imaginary number capacitor 540-2 connected thereto correspond to a passive switched capacitor circuit of the second set. Furthermore, differential amplifiers 550-1 to 550-4 correspond to a combining section that combines outputs of the passive switched capacitor circuits of the first set and second set.

Charge sharing circuits 530-1 to 530-8 each include sampling switch 531, history capacitor 532, charging switch 533, rotating capacitor 534, reset switch 535, dump switch 536, buffer capacitor 537, and charge sharing switch 538.

Capacitance values of history capacitor 532, rotating capacitor 534, buffer capacitor 537, and imaginary number capacitors 540-1 and 540-2 can be set to different values on the first set side and second set side. The respective capacitance values on the first set side are represented by $C_{H1}$, $C_{R1}$, $C_{B1}$ and $C_{IM1}$ and the respective capacitance values of the second set side are represented by $C_{H2}$, $C_{R2}$, $C_{B2}$ and $C_{IM2}$.

Four-system charge sharing circuits 530-1 to 530-4 on the first set side are different from four-system charge sharing circuits 530-5 to 530-8 on the second set side in the connection order of control signals inputted to charge sharing switches 538.

Thus, the connection order in four-system charge sharing circuits 530-1 to 530-4 and imaginary number capacitor 540-1 on the first set side is different from that of four-system charge sharing circuits 530-5 to 530-8 and imaginary number capacitor 540-2 on the second set side.

Four-system charge sharing circuits 530-1 to 530-4 on the first set side are connected to imaginary number capacitor 540-1 in the same order as that of Embodiment 3, and four-system charge sharing circuits 530-5 to 530-8 on the second set side are connected to imaginary number capacitor 540-2 in the same order as that of Embodiment 4. That is, between imaginary number capacitor 540-1 and imaginary number capacitor 540-2, the order of connection to charge sharing circuits 530-1 to 530-8 is reversed.

Four differential amplifiers 550-1 to 550-4 receive one of four outputs of charge sharing circuits 530-1 to 530-4 on the first set side and one of four outputs of charge sharing circuits 530-1 to 530-4 on the second set side. More specifically, first differential amplifier 550-1 receives two outputs of charge sharing circuits 530-1 and 530-7 where input phases of input current signals are mutually opposite. Two outputs having a similar relationship are also inputted to second to fourth differential amplifiers 550-2 to 550-4.

[Operation of Discrete-Time Analog Circuit 500]

Clock generating circuit 510 generates control signals of control signals S0, S1, S2 and S3 shown in FIG. 9 from reference frequency signal 24 generated in reference frequency oscillating section 14 and supplies the control signals to the respective switches.

Voltage-to-current conversion circuit 520 converts analog RF signal 23 amplified in low noise amplifier 12 as an input voltage signal ($v_{in}$) to a current (input current signal: gm×$v_{in}$).

Since combinations of control signals S0 to S3 used are different among four-system charge sharing circuits 530-1 to 530-4 on the first set side, the lines operate at timings shifted by ¼ cycles from one another. On the other hand, since combinations of control signals S0 to S3 used are different among four-system charge sharing circuits 530-5 to 530-8 on the second set side, the lines operate at timings shifted by ¼ cycles from one another. Here, operations of charge sharing circuits 530-1 and 530-5 will be described as representatives.

Sampling switch 531 is connected to the output of voltage-to-current conversion circuit 520 and switched on while control signal S0 supplied from clock generating circuit 510 is on. While control signal S0 is high, charging switch 533 is also simultaneously on, and therefore the analog RF input signal converted to a current in voltage-to-current conversion circuit 520 is stored as charge in history capacitor 532 and rotating capacitor 534. For this reason, the input signal becomes a discrete-time analog sample value and is converted from a radio frequency to a baseband (BB) frequency. Since history capacitor 532 stores charge by one cycle ahead of the cycle of control signals S0 to S3, IIR filtering through charge sharing is performed. This operation can be described by the following equation using a difference equation.

[11]

$$q_{in}=g_m\int_0^{T_{LO}/4} v_{in}(t)\exp(j\omega t)dt \approx g_{in} v_{in}(nT_{LO})\int_0^{T_{LO}/4}\exp(j\omega t)dt$$

$$q_{in}(n)+(C_{H1}+C_{H2})v_1(n-1)=(C_{R1}+C_{H1}+C_{R2}+C_{H2})v_1(n) \quad \text{(Equation 11)}$$

While control signal S1 and control signal S2 are sequentially driven high, rotating capacitor 534 and buffer capacitor 537 share charge via dump switch 536 first. Next, buffer capacitor 537 and imaginary number capacitors 540-1 and 540-2 share charge via charge sharing switch 538. That is, complex filtering is performed by buffer capacitor 537 holding charge by one cycle ahead, imaginary number capacitor 540-1 holding charge ¼ cycles ahead, and imaginary number capacitor 540-2 holding charge −¼ cycles ahead.

The operation of charge sharing circuit 530-1 can be approximated by the following equation.

[12]

$$C_{R1}v_1(n)+C_{B1}v_{2A}(n-1)+jC_{IM1}v_{2A}(n)=(C_{R1}+C_{B1}+C_{IM1})v_{2A}(n) \quad \text{(Equation 12)}$$

Here, $v_{2A}$ is a potential on one end side of buffer capacitor 537 of charge sharing circuit 530-1 on the first set side.

Similarly, the operation of charge sharing circuit 530-5 can be approximated by the following equation.

[13]

$$C_{R2}v_1(n)+C_{B2}v_{2B}(n-1)-jC_{IM2}v_{2B}(n)=(C_{R2}+C_{B2}+C_{IM2})v_{2B}(n) \quad \text{(Equation 13)}$$

Here, $V_{2B}$ is a potential on one end side of buffer capacitor 537 of charge sharing circuit 530-5 on the second set side.

While control signal S3 is high, the charge stored in rotating capacitor 534 is discharged when rotating capacitor 534 is connected to a reference potential via reset switch 535.

Eight charge sharing circuits 530-1 to 530-8 repeat similar operations at timings shifted by ¼ cycles from one another.

Differential amplifier 550-1 receives the outputs of two charge sharing circuits 530-1 and 530-7 to which currents are inputted at phases shifted by ½ cycles as two inputs. In charge sharing circuits 530-5 and 530-7 on one set side, since current input phases are in phase and opposite phase, the sign of output $v_{2B}$ is reversed. Thus, the output voltage of differential amplifier 550-1 becomes a difference between the two outputs of charge sharing circuits 530-1 and 530-7, that is, the following equation.

[14]

$$v_{out}(n)=G(v_{2A}(n)+v_{2B}(n)) \quad \text{(Equation 14)}$$

Here, G is a gain of the differential amplifier.

Transfer function H(z) of entire discrete-time analog circuit 500 can be calculated by z-converting the input/output and calculating a ratio of Vout(z) and Vin(z). The transfer function is given by the following equation and it is possible to realize a complex type transfer function having imaginary number unit "j" in the transfer function.

[15]

$$H(z) \approx \frac{g_m T_{LO}}{\sqrt{2}\pi} \cdot \frac{1}{(C_{R1}+C_{R2})+(C_{H1}+C_{H2})(1-z^{-1})} \cdot$$

$$G\left(\frac{C_{R1}}{C_{R1}+C_{B1}(1-z^{-1})+C_{IM1}(1-j)} + \frac{C_{R2}}{C_{R2}+C_{B2}(1-z^{-1})+C_{IM2}(1+j)}\right)$$

(Equation 15)

Figure 16:
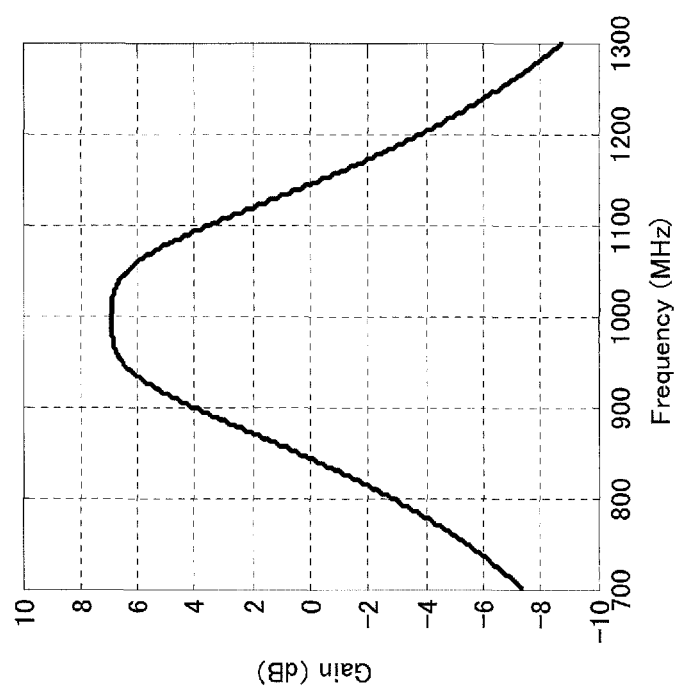
FIG. 16 is a characteristic diagram illustrating an example of filter characteristics realized by the discrete-time analog circuit according to Embodiment 5 of the present invention.

FIG. 16 is a characteristic diagram illustrating an example of filter characteristics realized by the discrete-time analog circuit according to Embodiment 5 of the present invention.

FIG. 16 shows an example of the frequency characteristics of a conversion gain when $f_{LO}=1$ GHz, gm=10 mS, $C_{H1}=C_{H2}=100$ fF, $C_{R1}=100$ fF, $C_{R2}=92$ fF, $C_{B1}=C_{B2}=1$ pF, $C_{IM1}=C_{IM2}=500$ fF. The horizontal axis shows an input frequency of a radio signal and the vertical axis shows a conversion gain. Discrete-time analog circuit 500 according to Embodiment 5 combines characteristics obtained by shifting the characteristic curve of a transfer function ($C_{IM}=0$ in equation 4) of a conventional real number coefficient leftward and rightward, and can thereby obtain a flat passband. More specifically, wideband frequency characteristics are obtained which have a fractional bandwidth of 10% at an in-band deviation of 0.5 dB.

Discrete-time analog circuit 500 of Embodiment 5 has a configuration in which imaginary number capacitors 540-1 and 540-2 are connected to nodes other than the input nodes of the respective lines of charge sharing circuits 530-1 to 530-8. Therefore, it is possible to reduce the influence of a parasitic capacitance of voltage-to-current conversion circuit 120 and accurately share charge among charge sharing circuits 530-1 to 530-8 in which a current input phase is shifted by ¼ cycles via imaginary number capacitors 540-1 and 540-2.

Discrete-time analog circuit 500 of Embodiment 5 has a configuration in which imaginary number capacitors 540-1 and 540-2 are connected to nodes other than the input nodes of the respective lines of charge sharing circuits 530-1 to 530-8. Thus, it is possible to independently determine the ratio of charge sharing among the respective phases via imaginary number capacitors 540-1 and 540-2 on the first set side and second set side.

In order to obtain a similar degree of freedom with imaginary number capacitors 540-1 and 540-2 connected to the input nodes, it is necessary to provide voltage-to-current conversion circuits 520 on the first set side and second set side, respectively.

However, discrete-time analog circuit 500 of Embodiment 5 can set frequency characteristics with a high degree of freedom with the configuration using above-described one voltage-to-current conversion circuit 520.

Although a configuration has been described above as an example where rotating capacitor 534, buffer capacitor 537 and imaginary number capacitor 540-1 or 540-2 are connected at staggered timings, similar characteristics can be obtained even with a configuration in which these capacitors are simultaneously connected.

In a configuration in which rotating capacitor 534, buffer capacitor 537, and imaginary number capacitor 540-1 or 540-2 are not simultaneously connected, the same equation as in the case where the capacitors are simultaneously connected under the condition of $C_B \gg C_R$ is applied as described using equation 7 and equation 8. In order to realize a wideband, fixing one of capacitance values $C_{IM1}$ and $C_{IM2}$ of two imaginary number capacitors 540-1 and 540-2, and adjusting the other value makes it possible to easily realize target characteristics.

A configuration has been described above as an example where two outputs which are mutually opposite phases on the first set side and second set side are combined, and further subtracted from each other and combined by a differential amplifier. However, it is also possible to adopt a configuration in which two mutually in-phase outputs are combined on the first set side and second set side, and further added up and combined by an adder, and similar frequency characteristics can also be obtained with this configuration.

Embodiment 6

Configuration of Discrete-Time Analog Circuit 600

Figure 17:
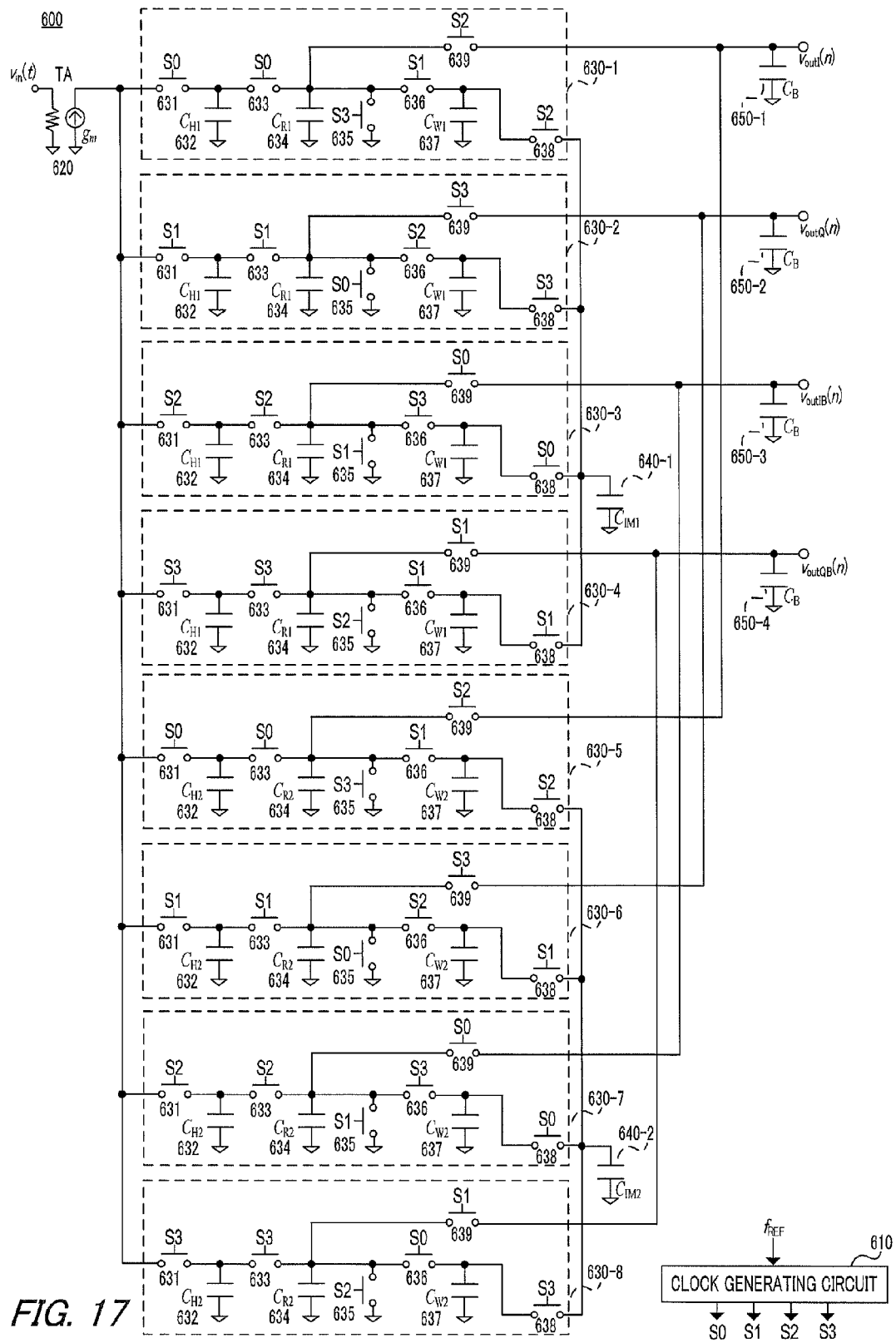
FIG. 17 is a circuit diagram illustrating a configuration of a discrete-time analog circuit according to Embodiment 6 of the present invention.

FIG. 17 is a block diagram illustrating an example of main components of discrete-time analog circuit 600 according to present Embodiment 6. Discrete-time analog circuit 600 corresponds to discrete-time analog circuit 13 in FIG. 7 and constitutes a sampling mixer circuit.

Discrete-time analog circuit 600 includes clock generating circuit 610, voltage-to-current conversion circuit (TA: transconductance amplifier, transconductance value=gm) 620, two sets of four-system charge sharing circuits 630-1 to 630-8, imaginary number capacitors 640-1 and 640-2, and buffer capacitors 650-1 to 650-4.

Here, four-system charge sharing circuits 630-1 to 630-4 on the first set side and one imaginary number capacitor 640-1 connected thereto correspond to a first set passive switched capacitor circuit. Four-system charge sharing circuits 630-5 to 630-8 on the second set side and one imaginary number capacitor 640-2 connected thereto correspond to a second set passive switched capacitor circuit. In addition, buffer capacitors 650-1 to 650-4 correspond to a combining section that combines outputs of the passive switched capacitor circuits of the first set and second set.

Charge sharing circuits 630-1 to 630-8 each include sampling switch 631, history capacitor 632, charging switch 633, rotating capacitor 634, reset switch 635, dump switch 636, weight capacitor 637, charge sharing switch 638, and output switch 639.

Respective capacitance values of history capacitor 632, rotating capacitor 634, weight capacitor 637, and imaginary number capacitors 640-1 and 640-2 can be set to different values on the first set side and second set side. The respective capacitance values on the first set side are represented by $C_{H1}$, $C_{R1}$, $C_{W1}$ and $C_{IM1}$, and the respective capacitance values on the second set side are represented by $C_{H2}$, $C_{R2}$, $C_{W2}$ and $C_{IM2}$.

Control signals inputted to charge sharing switches 638 are different between charge sharing circuits 630-1 to 630-4 on the first set side and charge sharing circuits 630-5 to 630-8 on the second set side. Four-system charge sharing circuits 630-1 to 630-4 on the first set side are connected to imaginary number capacitor 640-1 in the same order as the input order of input current signals. Four-system charge sharing circuits 630-5 to 630-8 on the second set side are connected to imaginary number capacitor 640-2 in order reverse to the input order of input current signals. That is, the order of connections to charge sharing circuits 630-1 to 630-8 is reversed between imaginary number capacitor 640-1 and imaginary number capacitor 640-2.

As one of main differences from Embodiment 5, outputs are combined by the differential amplifier in Embodiment 5, whereas in Embodiment 6, charge is shared by buffer capacitors 650-1 and 650-4 via output switch 639 to thereby form a combined sum of two outputs.

One of charge sharing circuits 630-1 to 630-4 on the first set side and one of charge sharing circuits 630-5 to 630-8 on the second set side are connected to each of four buffer capacitors 650-1 to 650-4, the input phase of an input current signal of the latter being in phase with that of the former.

[Operation of Discrete-Time Analog Circuit 600]

Clock generating circuit 610 generates control signals of control signals S0, S1, S2 and S3 shown in FIG. 9 from reference frequency signal 24 generated in reference frequency oscillating section 14 and supplies the control signals to the respective switches.

Voltage-to-current conversion circuit 620 converts analog RF signal 23 amplified in low noise amplifier 12 as input voltage signal ($v_{in}$) to a current (input current signal: $gm \times v_{in}$).

Since combinations of control signals S0 to S3 used are different among four-system charge sharing circuits 630-1 to 630-4 on the first set side, the lines operate at timings shifted by ¼ cycles from one another. Since combinations of control signals S0 to S3 are different among four-system charge sharing circuits 630-5 to 630-8 on the second set side, the lines operate at timings shifted by ¼ cycles from one another. Here, operations of charge sharing circuits 630-1 and 630-5 will be described as representatives.

Sampling switch 631 is connected to the output of voltage-to-current conversion circuit 620 and is switched on while control signal S0 supplied from clock generating circuit 610 is high. While control signal S0 is high, since charging switch 633 is also simultaneously on, an analog RF input signal converted to a current in voltage-to-current conversion circuit 620 is stored as charge in history capacitor 632 and rotating capacitor 634.

Thus, the input signal becomes a discrete-time analog sample value and is converted from a radio frequency to a baseband (BB) frequency. In addition, since history capacitor 632 stores charge one cycle ahead, IIR filtering by charge sharing is performed. This operation can be described by the following equation using a difference equation.

[16]

$$q_{in} = g_m \int_0^{T_{LO}/4} v_{in}(t) \exp(j\omega t) dt \approx g_m v_{in}(nT_{LO}) \int_0^{T_{LO}/4} \exp(j\omega t) dt$$

$$q_{in}(n) + (C_{H1}C_{H2})v_1(n-1) = (C_{R1}+C_{H1}+C_{R2}+C_{H2})v_1(n) \quad \text{(Equation 16)}$$

Next, while control signal S1 is high, rotating capacitor 634, weight capacitor 637, and imaginary number capacitor 640-1 or 640-2 share charge via charge sharing switch 638. That is, complex filtering is performed by weight capacitor 637 storing charge one cycle ahead, imaginary number capacitor 640-1 storing charge ¼ cycles ahead and imaginary number capacitor 640-2 storing charge ¾ cycles ahead.

The operation of charge sharing circuit 630-1 can be described by the following equation.

[17]

$$C_{R1}v_1(n) + C_{W1}v_{2A}(n-1) + jC_{IM1}v_{2A}(n) = (C_{R1}+C_{W1}+C_{IM1})v_{2A}(n) \quad \text{(Equation 17)}$$

Here, $v_{2A}$ is a potential on one end side of rotating capacitor 634 after charge sharing on the first set side.

Similarly, the operation of charge sharing circuit 630-5 can be described by the following equation.

[18]

$$C_{R2}v_1(n) + C_{W2}v_{2B}(n-1) - jC_{IM2}v_{2B}(n) = (C_{R2}+C_{W2}+C_{IM2})v_{2B}(n) \quad \text{(Equation 18)}$$

Here, $v_{2B}$ is a potential on one end side of rotating capacitor 634 after charge sharing on the second set side.

In addition, while control signal S2 is high, two rotating capacitors 634 on the first set side and second set side, and one buffer capacitor 650-1 share charge and form output potential Vout via output switch 639. This operation can be described by the following equation.

[19]

$$C_{R1}v_{2A}(n) + C_{R2}v_{2B}(n) + C_B v_{out}(n-1) = (C_{R1}+C_{R2}+C_B)v_{out}(n) \quad \text{(Equation 19)}$$

Output potential Vout corresponds to output potential VoutI in FIG. 17.

Next, while control signal S3 is high, rotating capacitor 634 is connected to a reference potential via reset switch 635 and charge stored in rotating capacitor 634 is thereby discharged.

The above-described operation is repeated in first charge sharing circuits 630-1 and 630-5. In addition, second to fourth lines of charge sharing circuit 630-2 to 630-4, and 630-6 to 630-8 repeat similar operations at timings shifted by ¼ cycles from one another. Respective output potentials $V_{out}$ of second to fourth lines of charge sharing circuits 630-2 to 630-4, and 630-6 to 630-8 correspond to $V_{out}Q$, $V_{out}IB$ and $V_{out}QB$ in FIG. 17, respectively.

A transfer function of entire discrete-time analog circuit 600 can be calculated by z-converting an input/output and calculating a ratio of z-converted input/output Vout(z) and Vin(z). The transfer function is given by the following equation.

[20]

$$H(z) \approx \frac{g_m T_{LO}}{\sqrt{2}\pi} \cdot \frac{1}{(C_{R1}+C_{R2})+(C_{H1}+C_{H2})(1-z^{-1})} \cdot \left( \frac{C_{R1}}{C_{R1}+C_{W1}(1-z^{-1})+C_{IM1}(1-j)} + \frac{C_{R2}}{C_{R2}+C_{W2}(1-z^{-1})+C_{IM2}(1+j)} \right) \cdot \frac{C_{R1}+C_{R2}}{C_{R1}+C_{R2}+C_B(1-z^{-1})} \quad \text{(Equation 20)}$$

The transfer function in equation 20 has a complex pole as in the case of the transfer function of discrete-time analog circuit 500 of Embodiment 5. Thus, discrete-time analog circuit 600 of Embodiment 6 can realize wide bandpass characteristics as in the case of the frequency characteristic in FIG. 16.

Discrete-time analog circuit 600 of Embodiment 6 adopts a configuration of combining the output on the first set side and the output on the second set side using output switch 639 and buffer capacitors 650-1 to 650-4. Therefore, it is possible to reduce variations of the frequency characteristic caused by variations in manufacturing of elements.

A configuration has been described above as an example where rotating capacitor 634, weight capacitor 637, and imaginary number capacitor 640-1 or imaginary number capacitor 640-2 are connected at staggered timings. However, similar characteristics may also be obtained even when a configuration is adopted in which these capacitors are simultaneously connected.

Embodiment 7

Configuration of Discrete-Time Analog Circuit 700

Figure 18:
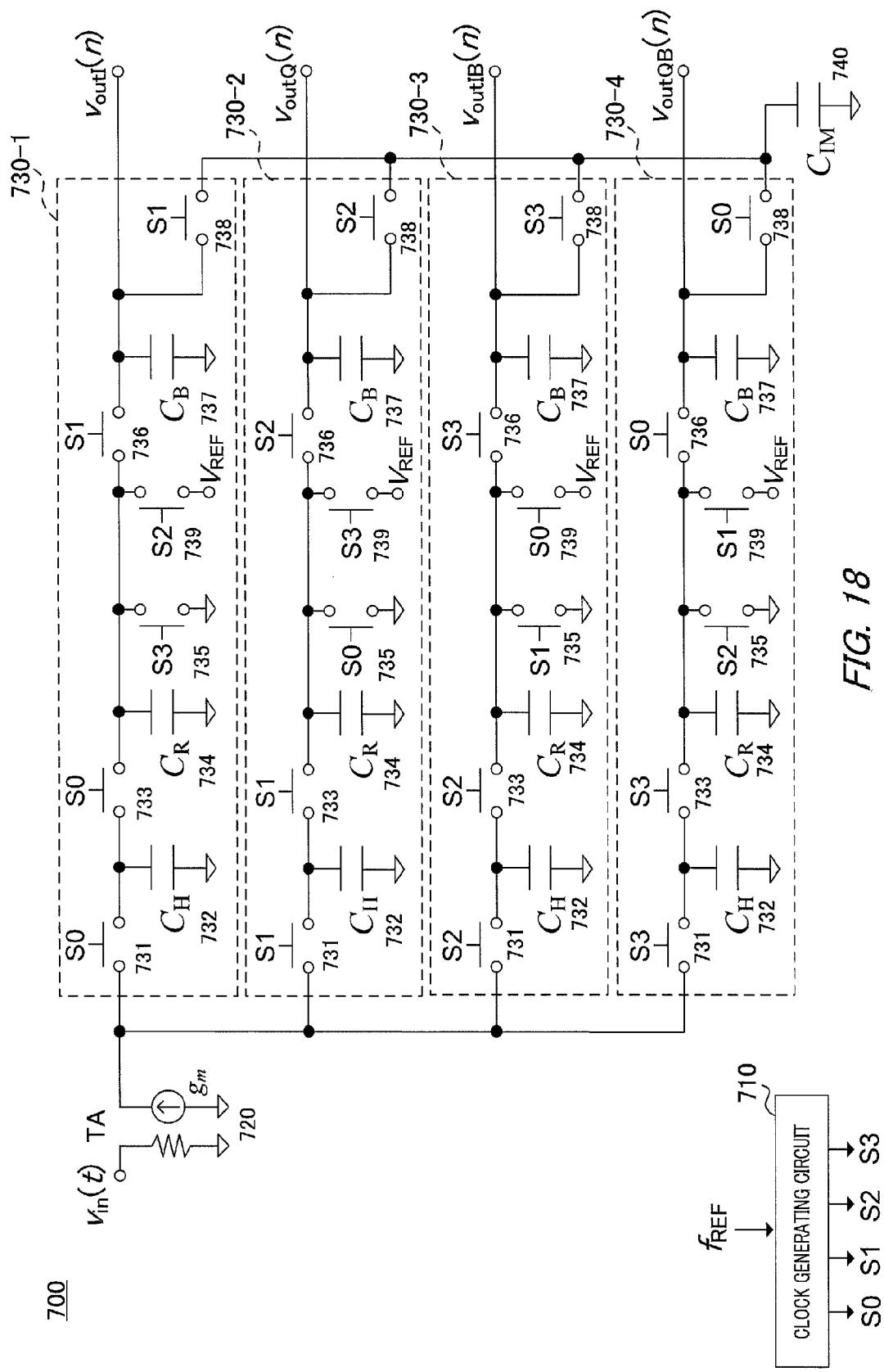
FIG. 18 is a circuit diagram illustrating a configuration of a discrete-time analog circuit according to Embodiment 7 of the present invention.

FIG. 18 is a block diagram illustrating an example of main components of discrete-time analog circuit 700 according to present Embodiment 7. Discrete-time analog circuit 700 corresponds to discrete-time analog circuit 13 in FIG. 7 and constitutes a sampling mixer circuit.

Discrete-time analog circuit 700 adds pre-charge switch 739 and bias potential $V_{REF}$ to discrete-time analog circuit 100 of Embodiment 1, and the rest of the configuration is the same. Identical components in FIG. 18 are assigned reference numerals 700s instead of 100s in FIG. 8.

Each switch is configured using a semiconductor device of, for example, MOSFET (metal-oxide-semiconductor field-effect transistor) and an appropriate bias potential is added to terminals other than control terminals, and therefore an on/off operation can be performed reliably.

Pre-charge switch 739 connects one end of rotating capacitor 734 to bias potential $V_{REF}$.

Bias potential $V_{REF}$ is set to a potential that causes charging switch 733 and dump switch 736 to switch off at high resistance during off operation irrespective of the level or the amount of change of input voltage signal $v_{in}$.

[Operation of Discrete-Time Analog Circuit 700]

Pre-charge switch 739 is switched on for a period of ¼ cycles after rotating capacitor 734 and buffer capacitor 737 share charge, and before charge of rotating capacitor 734 is reset. An on-operation causes the potential of rotating capacitor 734 in this period to be set to bias potential $V_{REF}$.

Even when the level or the amount of change of input voltage signal $v_{in}$ increases, bias potential $V_{REF}$ causes charging switch 733 and dump switch 736 to switch off at high resistance for this period. This prevents charge of buffer capacitor 737 and history capacitor 732 from leaking via charging switch 733 and dump switch 736 for this period. Therefore, it is possible to realize high linearity between input and output in discrete-time analog circuit 700.

Since bias potential $V_{REF}$ added to rotating capacitor 734 is released by reset switch 735 switching on, it is possible to reduce the influence on the filtering processing in charge sharing circuits 730-1 to 730-4. Therefore, the transfer function of discrete-time analog circuit 700 becomes the same as the transfer function of Embodiment 1 (equation 4), and the filter characteristics of discrete-time analog circuit 700 are similar to those of Embodiment 1.

Note that the connection node, connection timing, and level of bias potential $V_{REF}$ can be changed as appropriate. Thus, it is possible to prevent a leakage current in an off-state or prevent an increase of on-resistance in an on-state also for switches other than those described above for periods other than the above-described period.

Embodiment 8

Configuration and Operation of Discrete-Time Analog Circuit 800

Figure 19:
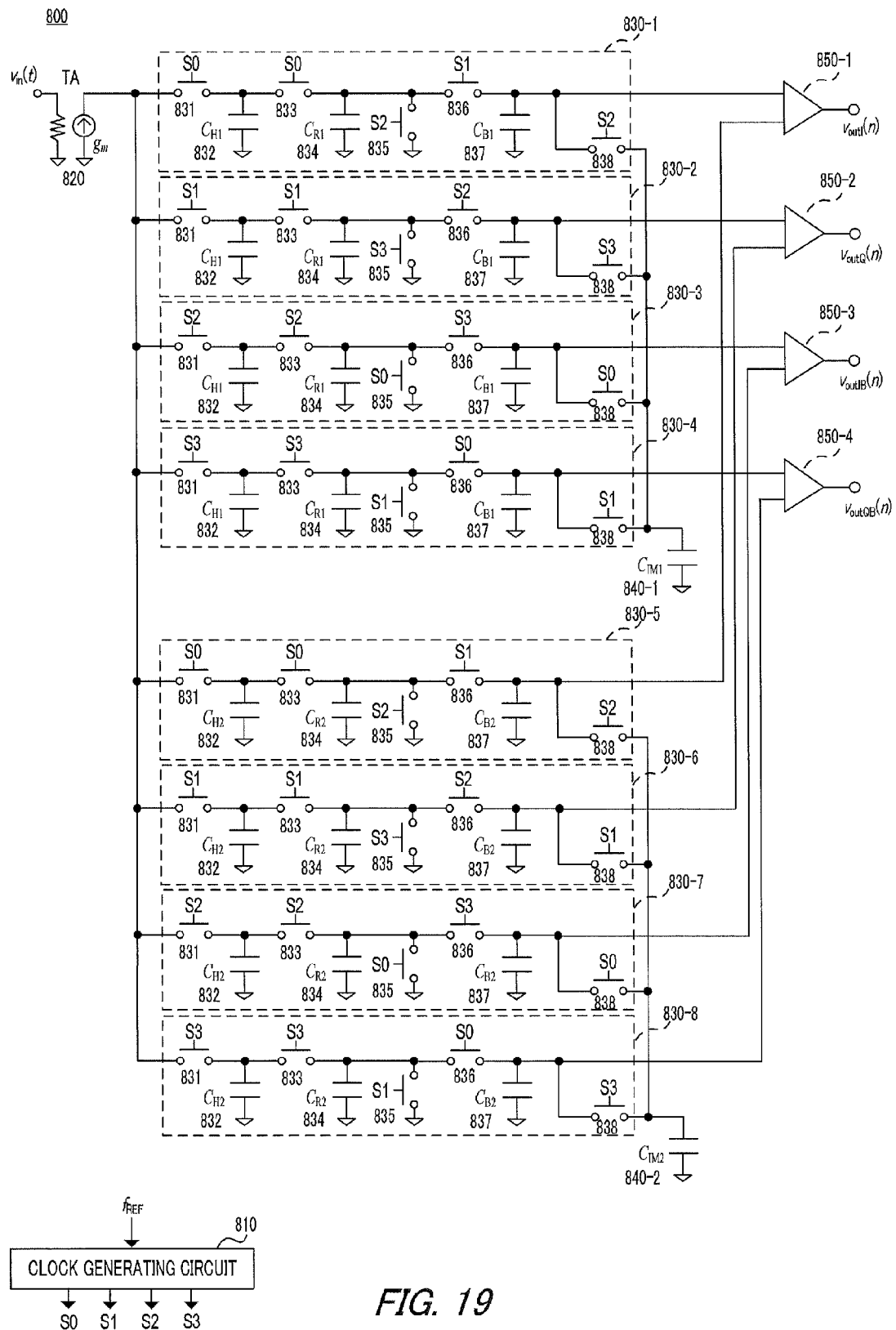
FIG. 19 is a circuit diagram illustrating a configuration of a discrete-time analog circuit according to Embodiment 8 of the present invention.

FIG. 19 is a block diagram illustrating an example of main components of discrete-time analog circuit 800 according to present Embodiment 8. Discrete-time analog circuit 800 corresponds to discrete-time analog circuit 13 in FIG. 7 and constitutes a sampling mixer circuit.

Discrete-time analog circuit 800 has a circuit configuration similar to that of discrete-time analog circuit 500 of Embodiment 5. However, combinations of two outputs combined by differential amplifiers 850-1 to 850-4 among outputs of charge sharing circuits 830-1 to 830-8 are different. In FIG. 19, components similar to those of Embodiment 5 are assigned reference numerals 800s instead of 500s in FIG. 15.

In discrete-time analog circuit 800, each of differential amplifiers 850-1 to 850-4 receives two mutually in-phase outputs on the first set side and second set side among outputs of charge sharing circuits 830-1 to 830-8 and amplifies the difference between the two.

Thus, output potentials of differential amplifiers 850-1 to 850-4 are given by the following equation.

[21]

$$v_{out}(n) = G(v_{2A}(n) - v_{2B}(n)) \quad \text{(Equation 21)}$$

Here, G is a gain of differential amplifiers 850-1 to 850-4.

Transfer function H(z) of entire discrete-time analog circuit 800 can be calculated by z-converting input/output and calculating a ratio of Vout(z) and Vin(z). The transfer function is given by the following equation.

[22]

$$H(z) \approx \frac{g_m T_{LO}}{\sqrt{2}\pi} \cdot \frac{1}{(C_{R1}+C_{R2})+(C_{H1}+C_{H2})(1-z^{-1})} \cdot G\left(\frac{C_{R1}}{C_{R1}+C_{B1}(1-z^{-1})+C_{IM1}(1-j)} - \frac{C_{R2}}{C_{R2}+C_{B2}(1-z^{-1})+C_{IM2}(1+j)}\right) \quad \text{(Equation 22)}$$

Figure 20:
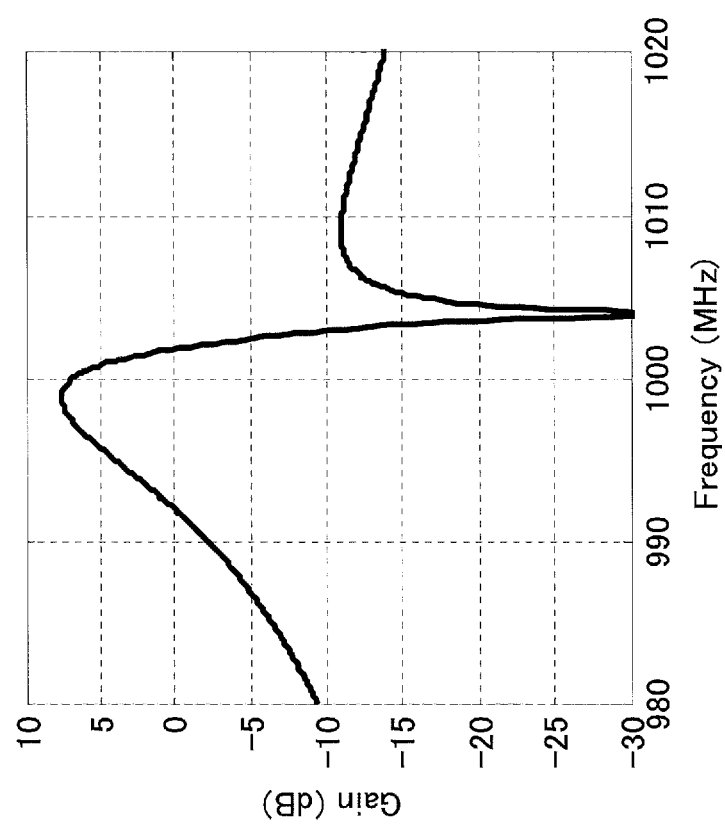
FIG. 20 is a characteristic diagram illustrating an example of filter characteristics realized by the discrete-time analog circuit according to Embodiment 8 of the present invention.

FIG. 20 is a characteristic diagram illustrating an example of filter characteristics realized by the discrete-time analog circuit according to Embodiment 8 of the present invention.

Since the transfer function in equation 22 is a difference between two transfer functions having complex number coefficients in a denominator thereof, an attenuation pole can be set at an asymmetric position in the horizontal direction centered on local frequency $f_{LO}$ in FIG. 20. This frequency characteristic allows a high image rejection ratio to be realized in a LOW-IF type receiver.

Embodiment 9

Configuration and Operation of Discrete-Time Analog Circuit 900

Figure 21:
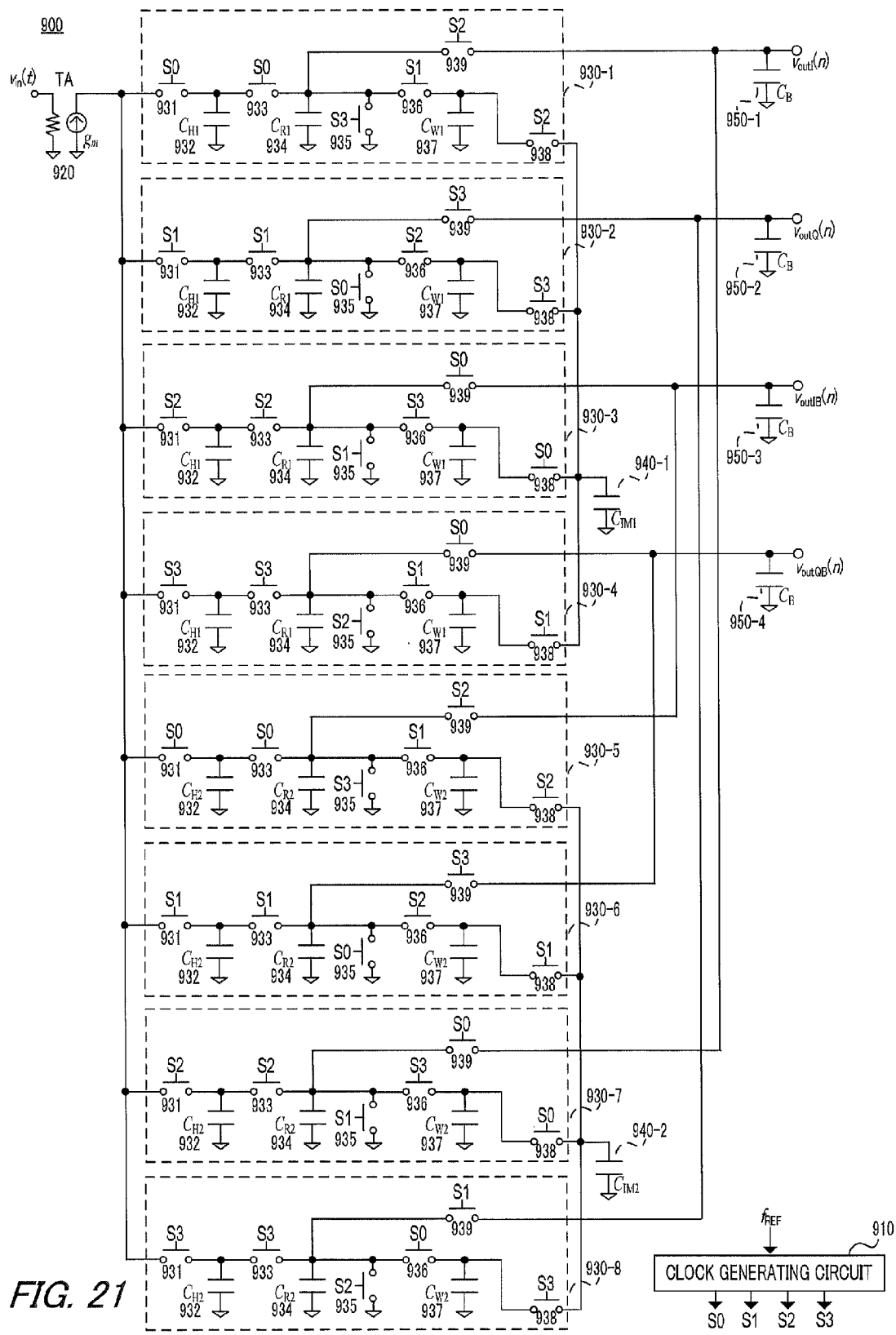
FIG. 21 is a circuit diagram illustrating a configuration of a discrete-time analog circuit according to Embodiment 9 of the present invention.

FIG. 21 is a block diagram illustrating an example of main components of discrete-time analog circuit 900 according to present Embodiment 9. Discrete-time analog circuit 900 corresponds to discrete-time analog circuit 13 in FIG. 7 and constitutes a sampling mixer circuit.

Discrete-time analog circuit 900 has a circuit configuration similar to that of discrete-time analog circuit 600 in Embodiment 6. However, combinations of charge sharing circuits 930-1 to 930-8 connected to each of buffer capacitors 950-1 to 950-4 are different. Components similar to those of Embodiment 6 are expressed by assigning reference numerals 900s in FIG. 21 instead of 600s in FIG. 17.

In discrete-time analog circuit 900, two charge sharing circuits in an opposite-phase relation on the first set side and second set side of charge sharing circuits 930-1 to 930-8 are connected to each of buffer capacitors 950-1 to 950-4. By sharing charge with the two charge sharing circuits, buffer capacitors 950-1 to 950-4 generate output potentials VoutI, VoutQ, VoutIB and VoutQB.

Thus, the respective output potentials of buffer capacitors 950-1 to 950-4 (collectively described as Vout) are given by the following equation.

[23]

$$C_{R1}v_{2A}(n) - C_{R2}v_{2B}(n) + C_B v_{out}(n-1) = (C_{R1} + C_{R2} + C_B) v_{out}(n) \quad \text{(Equation 23)}$$

Transfer function H(z) of entire discrete-time analog circuit 900 can be calculated by z-converting the input/output and calculating a ratio of Vout(z) and Vin(z). The transfer function is given by the following equation.

[24]

$$H(z) \approx \frac{g_m T_{LO}}{\sqrt{2}\pi} \cdot \frac{1}{(C_{R1}+C_{R2})+(C_{H1}+C_{H2})(1-z^{-1})} \cdot \left( \frac{C_{R1}}{C_{R1}+C_{W1}(1-z^{-1})+C_{IM1}(1-j)} - \frac{C_{R2}}{C_{R2}+C_{W2}(1-z^{-1})+C_{IM2}(1+j)} \right) \frac{C_{R1}+C_{R2}}{C_{R1}+C_{R2}+C_B(1-z^{-1})} \quad \text{(Equation 24)}$$

The transfer function in equation 24 is expressed by a difference between two transfer functions having complex number coefficients in a denominator thereof as in the case of the transfer function of discrete-time analog circuit 800 of Embodiment 8. Thus, an attenuation pole can be set at an asymmetric position in the horizontal direction centered on local frequency $f_{LO}$ and the filter characteristics shown in FIG. 20 are obtained as the characteristics of discrete-time analog circuit 800. In discrete-time analog circuit 800, the filter characteristics allow a high image rejection ratio to be realized in a LOW-IF type receiver.

Embodiment 10

Figure 22:
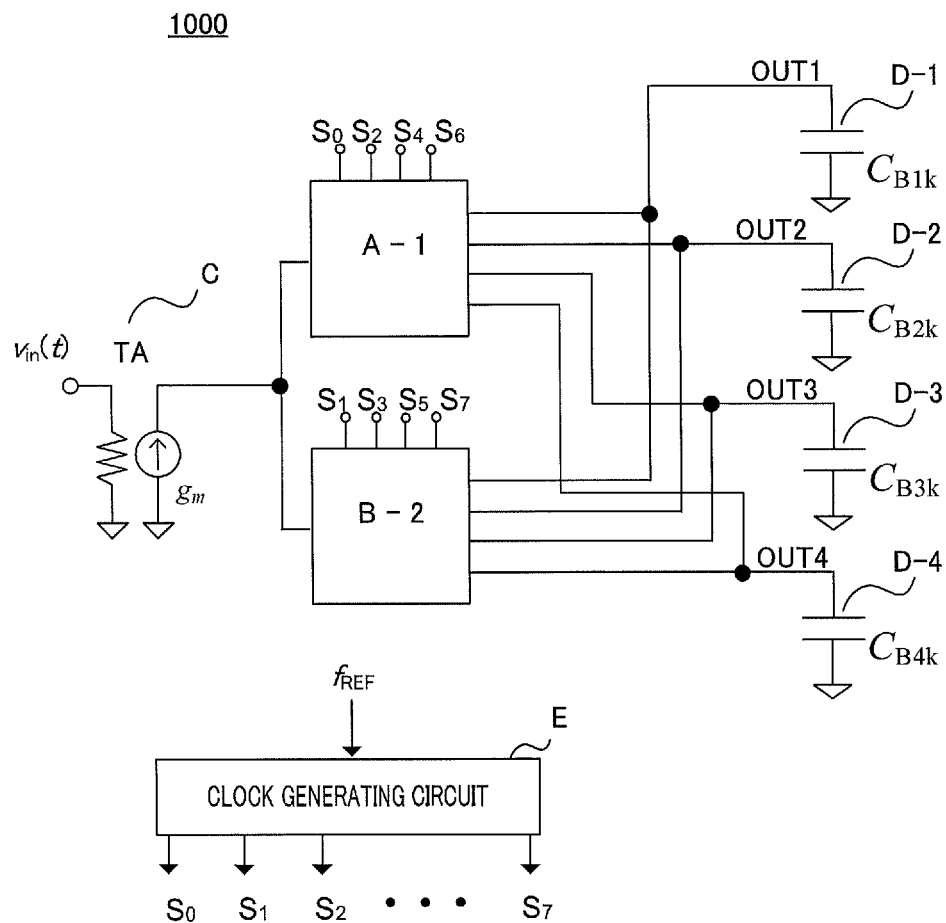
FIG. 22 is a configuration diagram illustrating a discrete-time analog circuit according to Embodiment 10 of the present invention.
Figure 23:
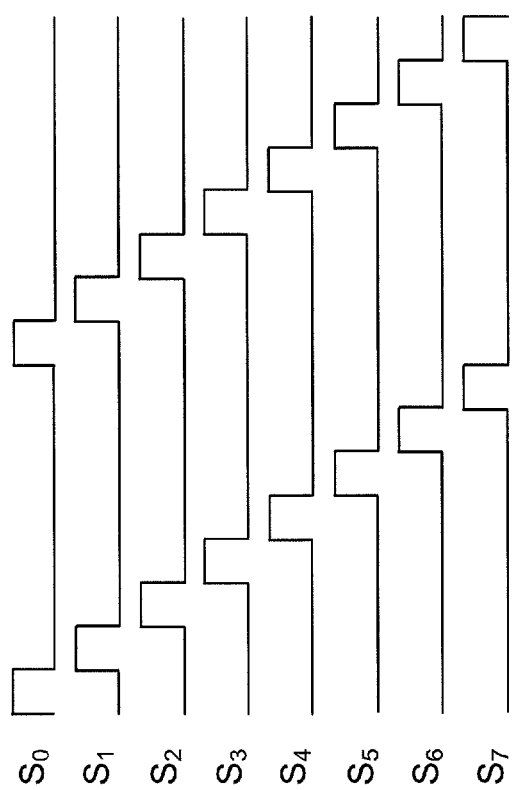
FIG. 23 is a timing chart of control signals inputted to the discrete-time analog circuit according to Embodiment 10 of the present invention.

FIG. 22 is a configuration diagram of a discrete-time analog circuit according to present Embodiment 10. FIG. 23 is a timing chart of control signals inputted to the discrete-time analog circuit according to Embodiment 10 of the present invention.

Discrete-time analog circuit 1000 of Embodiment 10 is, for example, a sampling mixer circuit corresponding to discrete-time analog circuit 13 in FIG. 7.

Discrete-time analog circuit 1000 is a circuit that operates on 8-phase clocks, and is provided with voltage-to-current conversion circuit (TA) C, charge sharing circuits A-1 and B-2, clock generating circuit E, combining circuits (capacitors in the drawing) D-1 to D-4

Clock generating circuit E supplies, to charge sharing circuits A-1 and B-2, clocks $S_0$ to $S_7$ with eight different phases whose high-pulse periods do not overlap with each other as shown in FIG. 23.

Discrete-time analog circuit 1000 of Embodiment 10 realizes frequency characteristics similar to those of discrete-time analog circuit 500 of Embodiment 5, but is different in that the circuit in Embodiment 10 operates on eight-phase clocks while Embodiment 5 operates on four-phase clocks (control signals S0, S1, S2 and S3).

Figures 24A, 24B:
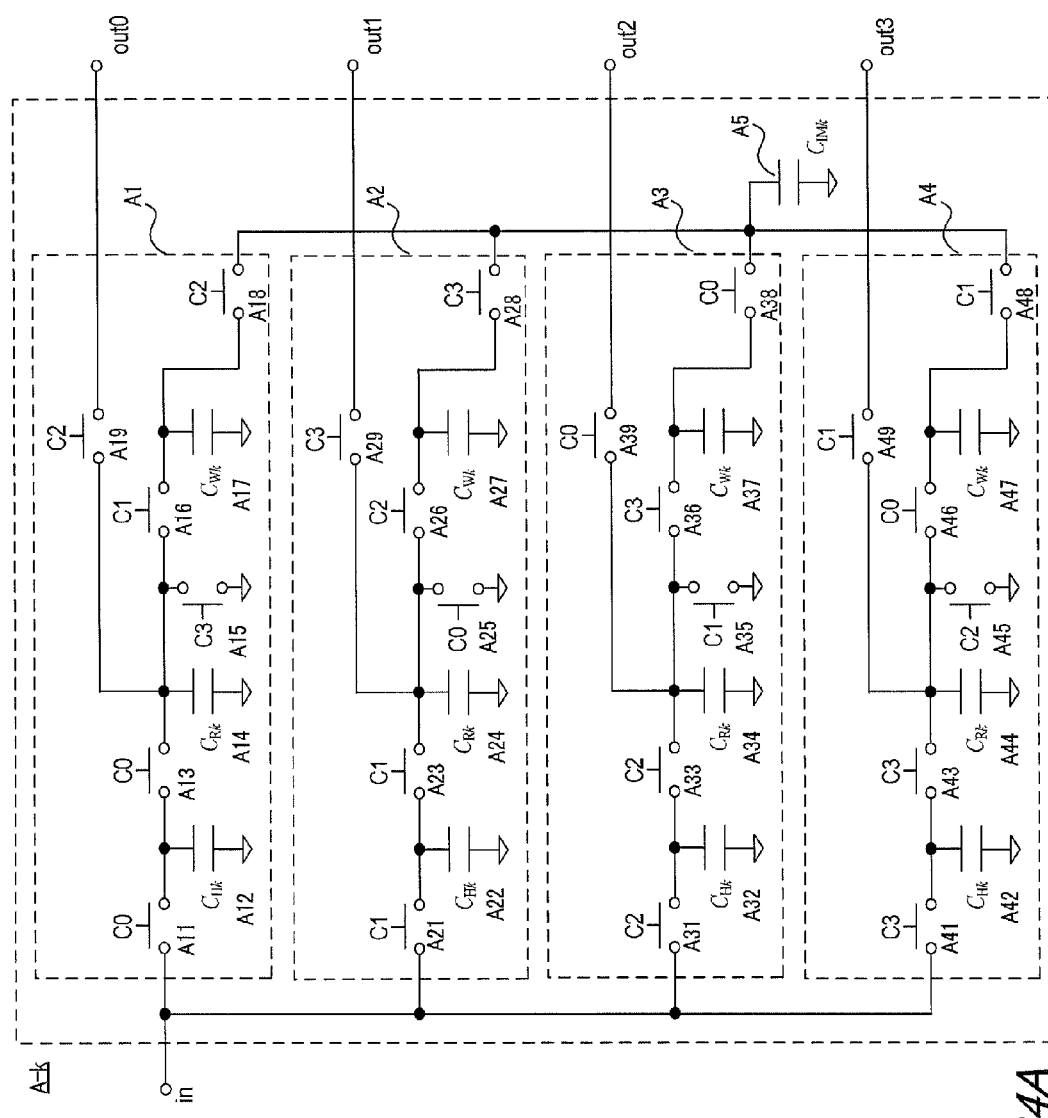
FIGS. 24A and 24B illustrate charge sharing circuit A-1 in FIG. 22.

FIGS. 24A and 24B illustrate charge sharing circuit A-1 in FIG. 22; FIG. 24A showing a circuit diagram and FIG. 24B showing a block diagram illustrating a terminal configuration thereof. In FIGS. 24A and 24B, the reference numeral of charge sharing circuit A-1 is generalized as A-k.

Charge sharing circuit A-1 is provided with four charge transfer circuits A1 to A4 having common input terminal in. Charge transfer circuits A1 to A4 each have a configuration similar to that of charge sharing circuits 330-1 to 330-4 in FIG. 13 and charge sharing circuits 630-1 to 630-4 in FIG. 17, and detailed description thereof will be omitted.

Control terminals C0 to C3 are supplied with clocks with four phases $S_0$, $S_2$, $S_4$ and $S_6$ (FIG. 23), which become high at every phase shift of 90 degrees and whose high-pulse periods do not overlap with each other.

Since charge transfer circuits A1 to A4 perform the same operation at every phase shift of 90 degrees, the operation of one charge transfer circuit A1 will be described as a representative.

(1) When C0 is high, charge inputted from input terminal in via switches A11 and A13 is stored in capacitance $C_{Hk}$(A12) and capacitance $C_{Rk}$(A14). As an initial state of this operation, capacitance $C_{Hk}$(A12) holds the charge stored through charge sharing one cycle ahead.

(2) When C1 is high, charge stored in capacitance $C_{Rk}$ (A14) and charge stored in capacitance $C_{Wk}$(A17) are shared. As an initial state of this operation, capacitance $C_{Wk}$(A17) holds the charge stored through charge sharing one cycle ahead.

(3) When C2 is high, capacitance $C_{Wk}$(A17) and inter-phase capacitance $C_{IMk}$(A5) performs charge sharing. As an initial state of this charge sharing, inter-phase capacitance $C_{IMk}$(A5) holds charge with a phase shifted by ¼ cycles through control terminals C0 to C3. Capacitance $C_{Rk}$ is simultaneously connected to output terminal out0.

(4) When C3 is high, capacitance $C_{Rk}$(A14) is grounded and reset via switch A15.

Charge transfer circuit A1 repeats above-described operations (1) to (4).

Figure 25B:
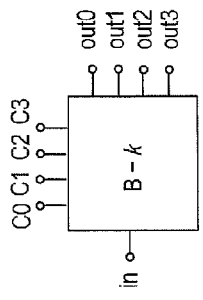
FIGS. 25A and 25B illustrate charge sharing circuit B-2 in FIG. 22.
Figure 25A:
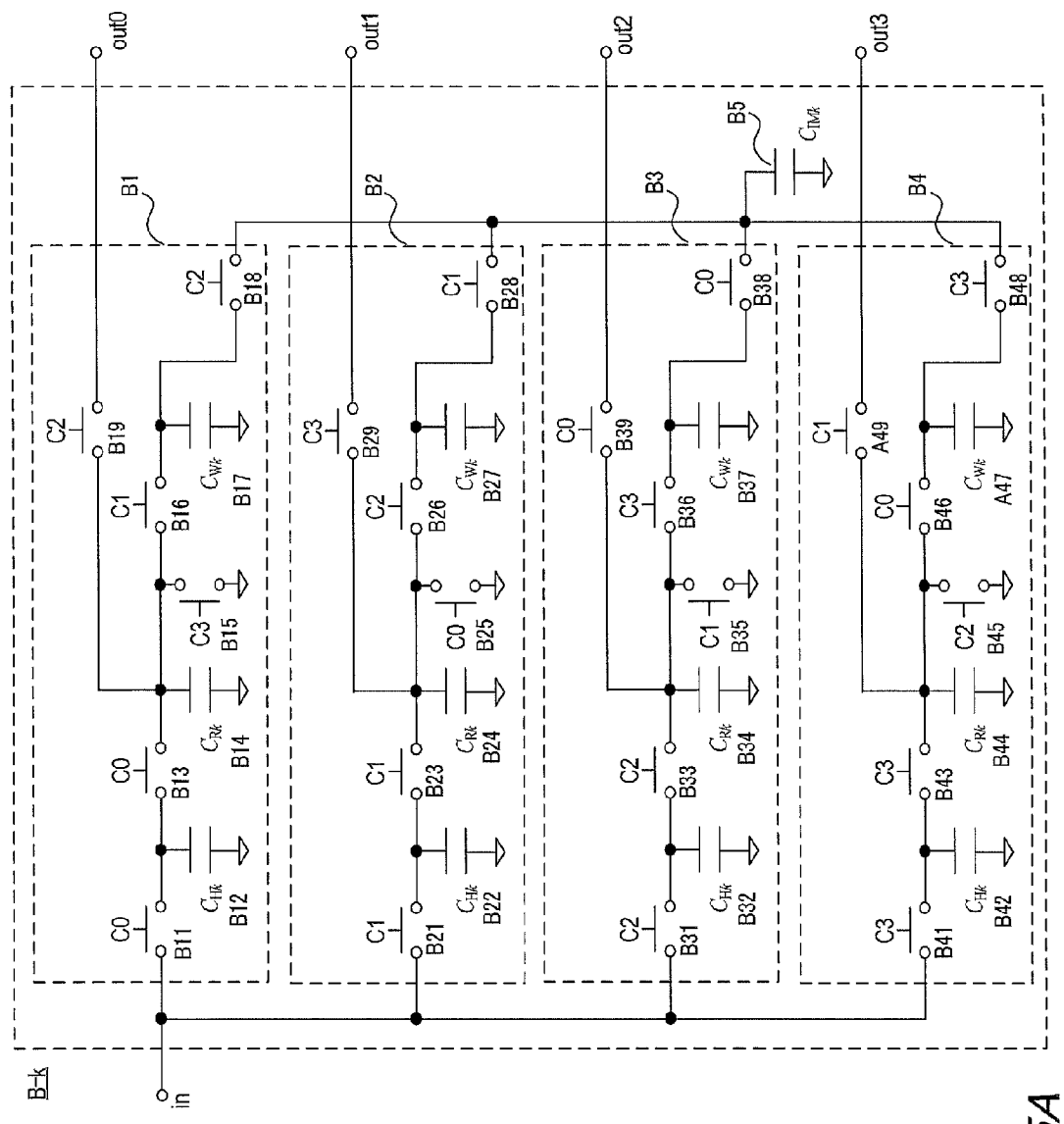

FIGS. 25A and 25B illustrate charge sharing circuit B-2 in FIG. 22; FIG. 25A showing a circuit diagram thereof and FIG. 25B showing a block diagram illustrating a terminal configuration thereof. In FIGS. 25A and 25B, the reference numeral of charge sharing circuit B-2 is generalized as B-k.

Charge sharing circuit B-2 is provided with four charge transfer circuits B1 to B4 having common input terminal in. Charge transfer circuit B1 to B4 each have a configuration similar to that of charge sharing circuits 430-1 to 430-4 in FIG. 14 and charge sharing circuits 630-5 to 630-8 in FIG. 17, and detailed description thereof will be omitted.

Control terminals C0 to C3 are supplied with clocks with four phases $S_1$, $S_3$, $S_5$ and $S_7$, which become high at every phase shift of 90 degrees and whose high-pulse periods do not overlap with each other.

In two charge sharing circuits B-2 and A-1, the order of clocks supplied to switches B18, B28, B38 and B48 is different from the order of clocks supplied to switches A18, A28, A38 and A48. The orders of the clocks are opposite to each other.

As shown in FIG. 22, output terminal out0 of charge sharing circuit A-1 (see FIG. 24B) and output terminal out0 of charge sharing circuit B-2 (see FIG. 25B) are connected to one terminal of capacitance $C_{B1k}$. Output terminal out1 of charge sharing circuit A-1 and output terminal out1 of charge sharing circuit B-2 are connected to one terminal of capacitance $C_{B2k}$. Output terminal out2 of charge sharing circuit A-1 and output terminal out2 of charge sharing circuit B-2 are connected to one terminal of capacitance $C_{B3k}$. Output terminal out3 of charge sharing circuit A-1 and output terminal out3 of charge sharing circuit B-2 are connected to one terminal of capacitance $C_{B4k}$. In this way, charge of capacitance $C_{Rk}$ of charge sharing circuit A-1 and charge of capacitance $C_{Rk}$ of charge sharing circuit B-2 are combined in capacitances $C_{B1k}$ to $C_{B4k}$.

The configuration of charge sharing circuit A-1 realizes characteristics with the peak of the frequency characteristics shifted leftward as shown in FIG. 10. The configuration of charge sharing circuit B-2 realizes characteristics with the peak of the frequency characteristics shifted rightward as shown in FIG. 12. Since discrete-time analog circuit 1000 in FIG. 22 is configured to combine in-phase outputs of charge sharing circuits A-1 and B-2, it is possible to realize wideband characteristics with a flattened in-band region as shown in FIG. 16.

Furthermore, since discrete-time analog circuit 1000 of Embodiment 10 has a configuration using clocks with eight phases, the number of capacitors simultaneously connected to voltage-to-current conversion circuit C decreases compared to the configuration in which eight sets of charge sharing circuits are operated on only clocks with four phases. Thus, when it is desired to increase the cutoff frequency of a filter during input and obtain wideband characteristics, the eight-phase clock configuration rather than the four-phase clock configuration allows the capacitance values of capacitances $C_{Hk}$ and $C_{Rk}$ to increase, which makes implementation easier.

Embodiment 11

Figure 26:
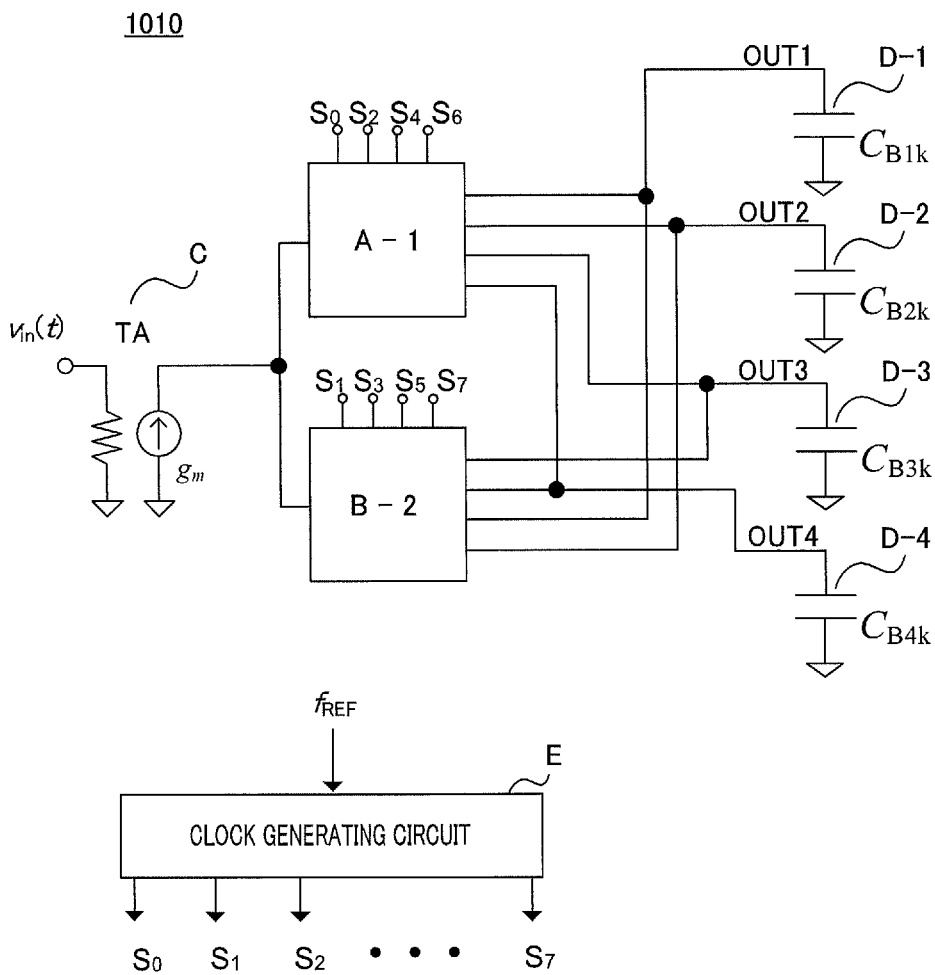
FIG. 26 is a configuration diagram illustrating a discrete-time analog circuit according to Embodiment 11 of the present invention.

FIG. 26 is a configuration diagram of discrete-time analog circuit 1010 according to present Embodiment 11.

Discrete-time analog circuit 1010 of Embodiment 11 has the same configuration as that of Embodiment 10 except in that the way of combining outputs of charge sharing circuits A-1 and B-2 is changed. Discrete-time analog circuit 1010 of Embodiment 11 realizes frequency characteristics similar to those of discrete-time analog circuit 600 of Embodiment 6, but is different in that the circuit in Embodiment 11 operates on clocks with eight phases while the circuit in Embodiment 6 operates on clocks with four phases (control signals S0, S1, S2 and S3).

As shown in FIG. 26, in Embodiment 11, output terminal out0 of charge sharing circuit A-1 and output terminal out2 of charge sharing circuit B-2 are connected to one terminal of capacitance $C_{B1k}$. Output terminal out1 of charge sharing circuit A-1 and output terminal out3 of charge sharing circuit B-2 are connected to one terminal of capacitance $C_{B2k}$. Output terminal out2 of charge sharing circuit A-1 and output terminal out0 of charge sharing circuit B-2 are connected to one terminal of capacitance $C_{B3k}$. Output terminal out3 of charge sharing circuit A-1 and output terminal out2 of charge sharing circuit B-2 are connected to one terminal of capacitance $C_{B4k}$. Thus, charge of capacitance $C_{Rk}$ of charge sharing circuit A-1 and charge of capacitance $C_{Rk}$ of charge sharing circuit B-2 are combined in capacitances $C_{B1k}$ to $C_{B4k}$.

Discrete-time analog circuit 1010 in FIG. 23 has a configuration in which opposite phase outputs of charge sharing circuits A-1 and B-2 are combined. For this reason, discrete-time analog circuit 1010 can realize frequency characteristics with a transmission zero point (attenuation pole) set at a specific frequency as shown in FIG. 20, asymmetric with respect to a local frequency in the horizontal direction, allowing for image rejection.

In addition, since discrete-time analog circuit 1010 of Embodiment 11 has a configuration using clocks with eight phases, the number of capacitances simultaneously connected to voltage-to-current conversion circuit C decreases compared to the configuration in which eight sets of charge sharing circuits are operated on only clocks with four phases. Thus, when it is desired to increase the cutoff frequency of a filter during input and obtain wideband characteristics, the eight-phase clock configuration rather than the four-phase clock configuration allows the capacitance values of capacitances $C_{Hk}$ and $C_{Rk}$ to increase, which makes the implementation easier.

Embodiment 12

Figure 27:
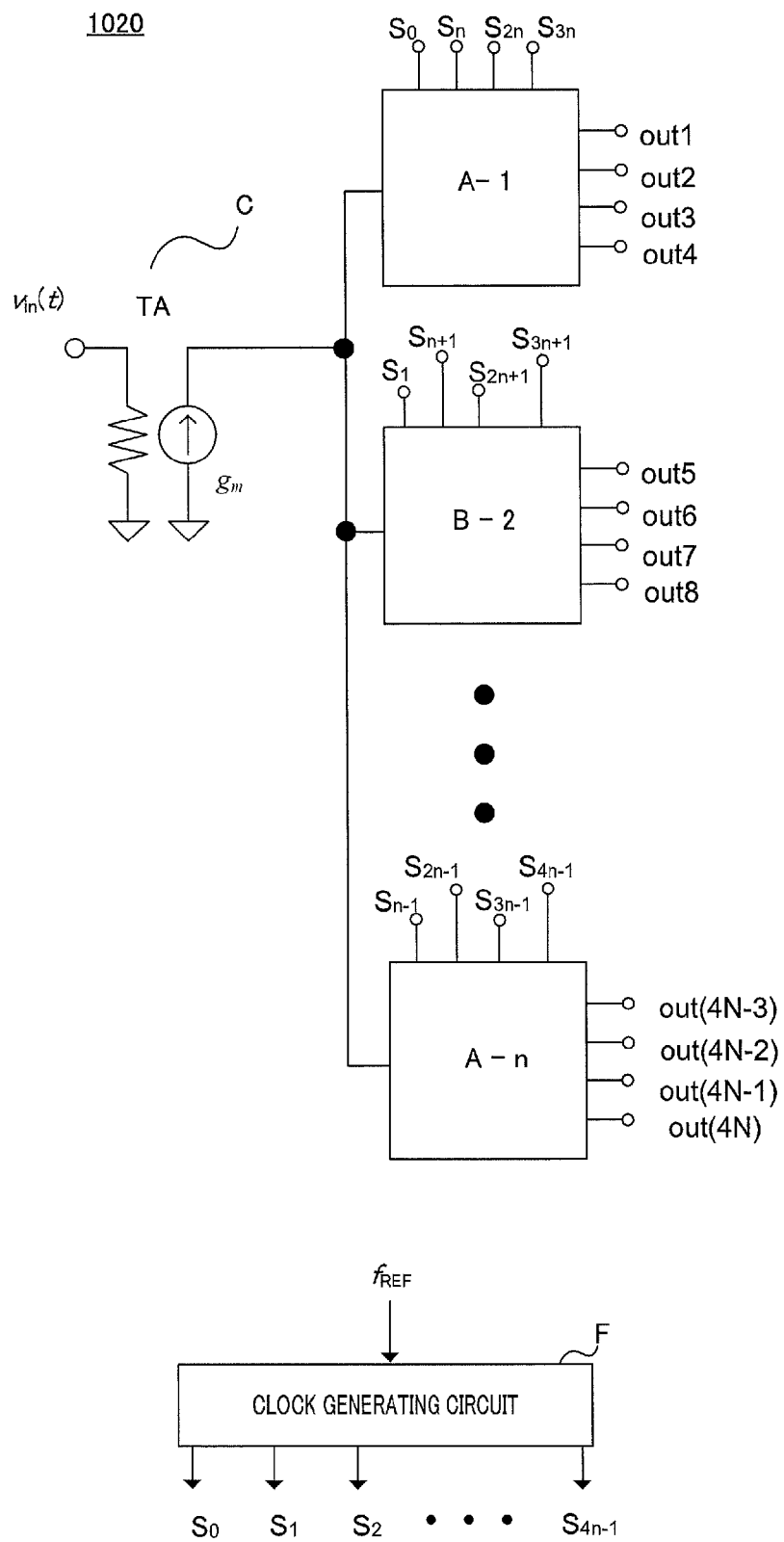
FIG. 27 is a configuration diagram illustrating a discrete-time analog circuit according to Embodiment 12 of the present invention.
Figure 28:
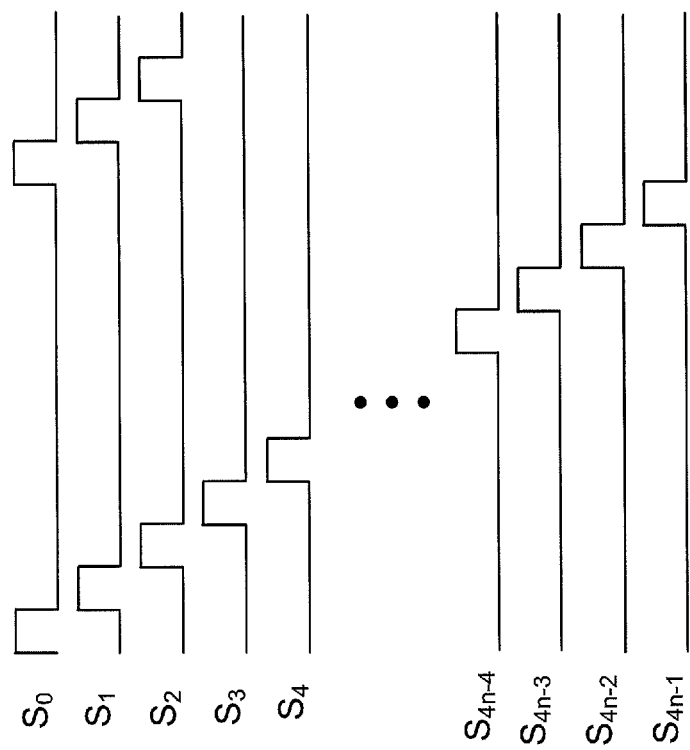
FIG. 28 is a timing chart of control signals inputted to the discrete-time analog circuit according to Embodiment 12 of the present invention.

FIG. 27 is a configuration diagram illustrating a discrete-time analog circuit according to Embodiment 12 of the present invention. FIG. 28 is a timing chart of control signals inputted to the discrete-time analog circuit according to Embodiment 12 of the present invention.

Discrete-time analog circuit 1020 of Embodiment 12 is a sampling mixer circuit corresponding to, for example, discrete-time analog circuit 13 in FIG. 7.

Discrete-time analog circuit 1020 is a circuit that operates on clocks with 4n phases. Discrete-time analog circuit 1020 is provided with voltage-to-current conversion circuit (TA) C, n charge sharing circuits A-1, B-2, . . . , A-n, clock generating circuit F, and a combining circuit (not shown) that combines outputs of n charge sharing circuits A-1, B-2, . . . , A-n.

Any one of the configuration in FIG. 24 and the configuration in FIG. 25 can be adopted for n charge sharing circuits A-1, B-2, . . . , A-n.

Clock generating circuit F supplies clocks with 4n different phases to charge sharing circuits A-1, B-2, . . . , A-n, whose high-pulse periods do not overlap with each other as shown in FIG. 28.

Charge sharing circuits A-1, B-2, . . . , A-n perform operation similar to that in Embodiment 10 operating on clocks with eight phases, and the frequency characteristics of input/output of the respective charge sharing circuits become left-shifted or right-shifted frequency characteristics. The amount of shift depends on capacitances $C_{Rk}$, $C_{Wk}$ and $C_{IMk}$.

The combining circuit combines the outputs of respective charge sharing circuits A-1, B-2, . . . , A-n so as to obtain desired characteristics. For example, a plurality of odd-numbered (2m−1: m is a natural number) charge sharing circuits A-1, A-3, . . . , A-n are assumed to have the configuration in FIG. 24 (left-shifted type). Furthermore, a plurality of even-numbered (2m: m is a natural number) charge sharing circuits B-2, B-4, . . . B-(n−1) are assumed to have the configuration in FIG. 25 (right-shifted type). The amount of left shift and the amount of right shift of these charge sharing circuits A-1, B-2, . . . , A-n are reduced little by little and mutually in-phase outputs are combined. Such a configuration allows wider band characteristics to be realized compared to the configuration shown in FIG. 22 in which outputs of two charge sharing circuits A-1 and B-2 are combined.

The above-described wider band can be realized by also increasing the number of charge sharing circuits in discrete-time analog circuit 500 of Embodiment 5. However, if the number of sets of charge sharing circuits is increased without changing the number of clock phases from four, the number of capacitances simultaneously connected to the voltage-to-current conversion circuit increases. For this reason, in order to increase the cutoff frequency of a filter during input and obtain wider band characteristics, it is necessary to reduce capacitance values of capacitances $C_{Hk}$ and $C_{Rk}$. Increasing the number of clock phases makes it possible to increase the cutoff frequency of the filter during input with the increased capacitance values of capacitances $C_{Hk}$ and $C_{Rk}$ and thus to facilitate implementation of capacitances. Embodiments 5 and 6 or Embodiments 10, 11 and 12 may be selected depending on which is easier to realize, increasing the number of clock phases or reducing the capacitance in the implementation method in a design target application.

Embodiments of the present invention have been described so far.

In above-described Embodiments 10 to 12, the configurations in FIG. 24 and FIG. 25 have been taken as examples as charge sharing circuits A-1, B-2, . . . , A-n. However, the charge sharing circuits shown in Embodiments 1 to 4, and 7 may be applied to these configurations. In above Embodiments 10 and 11, capacitances have been used as combining circuits D-1 to D-4, but the differential amplifiers shown in Embodiment 8 may also be used. Although the configuration of the combining circuit has been omitted in Embodiment 12, any one of capacitance and differential amplifier may be applied as the combining circuit.

The components of the receivers of the above-described embodiments are typically implemented as integrated circuits on semiconductor chips. The components of the receivers except the antennas may be formed as individual chips, or a part or all of the components may be integrated into a single chip.

The disclosure of Japanese Patent Application No. 2012-012374, filed on Jan. 24, 2012, including the specification, drawings and abstract is incorporated herein by reference in its entirety.

INDUSTRIAL APPLICABILITY

The sampling mixer circuit and receiver according to the present invention are useful for a high-frequency signal processing circuit of a receiver in a radio communication apparatus and suitable for a case where signal frequency conversion and filter processing are performed.

REFERENCE SIGNS LIST

10 Direct sampling receiver
11 Antenna
12 Low noise amplifier
13, 100, 200, 300, 400, 500, 600, 700, 800, 900, 1000, 1010, 1020 Discrete-time analog circuit
14 Reference frequency oscillating section
15 A/D conversion processing section
16 Digital reception processing section
110, 210, 310, 410, 510, 610, 710, 810, 910, E, F Clock generating circuit
120, 220, 320, 420, 520, 620, 720, 820, 920, C Voltage-to-current conversion circuit (TA)
130-1 to 130-4, 230-1 to 230-4, 330-1 to 330-4, 430-1 to 430-4, 530-1 to 530-8, 630-1 to 630-8, 730-1 to 730-4, 830-1 to 830-8, 930-1 to 930-8 Charge sharing circuit
131, 231, 331, 431, 531, 631, 731, 831, 931 Sampling switch
132, 232, 332, 432, 532, 632, 732, 832, 932 History capacitor
133, 233, 333, 433, 533, 633, 733, 833, 933 Charging switch
134, 234, 334, 434, 534, 634, 734, 834, 934 Rotating capacitor
135, 235, 335, 435, 535, 635, 735, 835, 935 Reset switch
136, 236, 336, 436, 536, 636, 736, 836, 936 Dump switch
639, 939 Output switch
137, 237, 337, 437, 537, 650-1 to 650-4, 737, 837, 950-1 to 950-4 Buffer capacitor
637, 937 Weight capacitor
138, 238, 338, 438, 538, 638, 738, 838, 938 Charge sharing switch
739 Pre-charge switch
140, 240, 340, 440, 540-1 to 540-2, 640-1 to 640-2, 740, 840-1 to 840-2, 940-1 to 940-2 Imaginary number capacitor
550-1 to 550-4, 850-1 to 850-4 Differential amplifier
A-1, B-2, . . . , A-n Charge sharing circuit
D-1, D-2, D-3, D-4 Combining circuit
A1, A2, A3, A4, B1, B2, B3, B4 Charge transfer circuit

The invention claimed is:

1. A sampling mixer circuit comprising:
a clock generating circuit that outputs four-phase control signals with four different phases having a cycle corresponding to a carrier frequency of an input signal;
a voltage-to-current conversion circuit that converts a voltage signal, which is based on the input signal, to a current signal;
four-system charge sharing circuits, each of which inputs the converted current signal to a plurality of capacitors according to different phases based on the four-phase control signals and which exchanges charge among the plurality of capacitors; and
an inter-phase capacitor that is selectively coupled to four nodes of the four-system charge sharing circuits based on the four-phase control signals, wherein the four nodes are not input nodes that receive the converted current signal.

2. The sampling mixer circuit according to claim 1, wherein the inter-phase capacitor is selectively coupled to the four nodes according to different phases based on the four-phase control signals.

3. The sampling mixer circuit according to claim 1, wherein:
the inter-phase capacitor is sequentially connected to the four-system charge sharing circuits in a predetermined order,
in which an input phase difference of the current signal between two consecutive charge sharing circuits of the four-system charge sharing circuits is 90° or −90°.

4. The sampling mixer circuit according to claim 1, wherein each of the four-system charge sharing circuits comprises:
a sampling switch that samples the current signal according to a predetermined phase;
a history capacitor disposed at a position subsequent to the sampling switch;
a charging switch that is switched on at a timing identical to that of the sampling switch;
a rotating capacitor disposed at a position subsequent to the charging switch;
a reset switch that connects the rotating capacitor to a ground;
a buffer capacitor that receives the sampled current signal and determines a potential of an output;
a dump switch that connects the rotating capacitor and the buffer capacitor; and
an inter-phase charge sharing switch that connects the buffer capacitor and the inter-phase capacitor.

5. The sampling mixer circuit according to claim 4, wherein a timing at which charge is transmitted from the rotating capacitor to the inter-phase capacitor is identical to a timing at which charge is transmitted from the rotating capacitor to the buffer capacitor.

6. The sampling mixer circuit according to claim 4, wherein a timing at which charge is transmitted from the rotating capacitor to the inter-phase capacitor is different from a timing at which charge is transmitted from the rotating capacitor to the buffer capacitor.

7. The sampling mixer circuit according to claim 1, further comprising:
two sets of passive switched capacitor circuits, each set including the four-system charge sharing circuits and the inter-phase capacitor, wherein the two sets have different connection orders in which the inter-phase capacitor is selectively coupled to the four-system charge sharing circuits; and
a combining section that combines outputs of the two sets of passive switched capacitor circuits.

8. The sampling mixer circuit according to claim 7, wherein each of the four-system charge sharing circuits comprises:
a sampling switch that samples the current signal according to a predetermined phase;
a history capacitor disposed at a position subsequent to the sampling switch;
a charging switch that is switched on at a timing identical to that of the sampling switch;
a rotating capacitor disposed at a position subsequent to the charging switch;
a reset switch that connects the rotating capacitor to a ground;
a buffer capacitor that receives the sampled current signal and determines a potential of an output;
a dump switch that connects the rotating capacitor and the buffer capacitor; and
an inter-phase charge sharing switch that connects the buffer capacitor and the inter-phase capacitor.

9. The sampling mixer circuit according to claim 8, wherein:
in a first set of the two sets of passive switched capacitor circuits, the connection order of the inter-phase capacitor and the four-system charge sharing circuits is an order in which an input phase difference of the current signal between two consecutive charge sharing circuits is positive; and
in a second set of the two sets of passive switched capacitor circuits, the connection order of the inter-phase capacitor and the four charge sharing circuit is an order in which an input phase difference of the current signal between two consecutive charge sharing circuits is negative.

10. The sampling mixer circuit according to claim 8, wherein the combining section comprises four differential amplifiers that respectively combine four system outputs of a first set of the two sets of passive switched capacitor circuits and four system outputs of a second set of the two sets of passive switched capacitor circuits.

11. The sampling mixer circuit according to claim 10, wherein the four differential amplifiers combine the fours system outputs of the first set of passive switched capacitor circuits and the four system outputs of the second set of passive switched capacitor circuits, respectively, wherein the four system outputs of the second set of passive switched capacitor circuits are in an opposite-phase relation to the four system outputs of the first set of passive switched capacitor circuits.

12. The sampling mixer circuit according to claim 10, wherein the four differential amplifiers combine the four system outputs of the first set of passive switched capacitor circuits and the four system outputs of the second set of passive switched capacitor circuits, respectively, wherein the four system outputs of the second set of passive switched capacitor circuits are in an in-phase relation to the four system outputs of the first set of passive switched capacitor circuits.

13. The sampling mixer circuit according to claim 7, wherein each of the four-system charge sharing circuits comprises:
a sampling switch that samples the current signal according to a predetermined phase;
a history capacitor disposed at a position subsequent to the sampling switch;
a charging switch that is switched on at a timing identical to that of the sampling switch;
a rotating capacitor disposed at a position subsequent to the charging switch;
a reset switch that connects the rotating capacitor to a ground;
a dump switch that connects the rotating capacitor and a weight capacitor;
an output switch coupled to the rotating capacitor; and
an inter-phase charge sharing switch that connects the weight capacitor and the inter-phase capacitor.

14. The sampling mixer circuit according to claim 13, wherein:
the combining section comprises four buffer capacitors that respectively receive charge transmitted from the four rotating capacitors in a first set of the two sets of passive switched capacitor circuits and charge transmitted from the four rotating capacitors in a second set of the two sets of passive switched capacitor circuits, and that perform charge sharing; and
the combining section outputs potentials of the four buffer capacitors.

15. The sampling mixer circuit according to claim 14, wherein the four buffer capacitors receive first charge of the respective rotating capacitors of the four-system charge sharing circuits in the first set of passive switched capacitor circuits and second charge of the respective rotating capacitors of the four-system charge sharing circuits in the second set of passive switched capacitor circuits, wherein the first charge and the second charge are in an in-phase relation.

16. The sampling mixer circuit according to claim 14, wherein the four buffer capacitors receive first charge of the respective rotating capacitors of the four-system charge sharing circuits in the first set of passive switched capacitor circuits and second charge of the respective rotating capacitors of the four-system charge sharing circuits in the second set of passive switched capacitor circuits, wherein the first charge and the second charge are in an opposite-phase relation.

17. A receiver comprising:
the sampling mixer circuit according to claim 1;
an antenna that receives the input signal;
a low noise amplifier that amplifies the input signal received by the antenna and that outputs the amplified signal to the sampling mixer circuit; and
an analog-to-digital conversion section that converts an output signal of the sampling mixer circuit from an analog signal to a digital signal.

18. The receiver according to claim 17, wherein:
the receiver is a low intermediate frequency receiver; and
the sampling mixer circuit outputs a low intermediate frequency band signal as the output signal.

19. A diversity receiver comprising:
a plurality of receivers, at least one of which is the receiver according to claim 18; and a digital processing section that selectively combines digital outputs from the plurality of receivers.

20. The sampling mixer circuit according to claim 1, wherein the inter-phase capacitor is selectively coupled to the four nodes of the four-system charge sharing circuits, respectively, via four inter-phase charge sharing switches.

* * * * *